(12) United States Patent
Ogihara et al.

(10) Patent No.: US 8,501,386 B2
(45) Date of Patent: Aug. 6, 2013

(54) SILICON-CONTAINING FILM-FORMING COMPOSITION, SILICON-CONTAINING FILM-FORMED SUBSTRATE, AND PATTERNING PROCESS

(75) Inventors: Tsutomu Ogihara, Jyoetsu (JP); Takafumi Ueda, Jyoetsu (JP); Toshiharu Yano, Jyoetsu (JP); Koji Hasegawa, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 59 days.

(21) Appl. No.: 13/205,262

(22) Filed: Aug. 8, 2011

(65) Prior Publication Data

US 2012/0052685 A1   Mar. 1, 2012

(30) Foreign Application Priority Data

Sep. 1, 2010  (JP) .................................. 2010-195379

(51) Int. Cl.
| | | |
|---|---|---|
| G03F 7/00 | (2006.01) | |
| G03F 7/004 | (2006.01) | |
| G03F 7/075 | (2006.01) | |
| G03F 7/09 | (2006.01) | |
| G03F 7/40 | (2006.01) | |

(52) U.S. Cl.
USPC ............... 430/270.1; 430/272.1; 430/311; 430/313; 430/317; 430/322; 430/325; 430/326; 430/331

(58) Field of Classification Search
USPC ............... 430/270.1, 272.1, 311, 313, 317, 430/322, 323, 325, 326, 331
See application file for complete search history.

(56) References Cited

U.S. PATENT DOCUMENTS

| | | | |
|---|---|---|---|
| 5,385,804 A | 1/1995 | Premlatha et al. | |
| 5,632,910 A | 5/1997 | Nagayama et al. | |
| 6,025,117 A | 2/2000 | Nakano et al. | |
| 7,875,417 B2 * | 1/2011 | Ogihara et al. | 430/270.1 |
| 8,026,038 B2 * | 9/2011 | Ogihara et al. | 430/270.1 |
| 8,029,974 B2 * | 10/2011 | Ogihara et al. | 430/270.1 |
| 2002/0187422 A1 | 12/2002 | Angelopoulos et al. | |
| 2003/0091929 A1 | 5/2003 | Nishi et al. | |
| 2004/0253461 A1 | 12/2004 | Ogihara et al. | |
| 2006/0019195 A1 | 1/2006 | Hatakeyama et al. | |
| 2007/0196773 A1 | 8/2007 | Weigel et al. | |
| 2009/0136869 A1 | 5/2009 | Ogihara et al. | |
| 2010/0196655 A1 | 8/2010 | Kai et al. | |
| 2011/0116024 A1 | 5/2011 | Tsuchimoto et al. | |

FOREIGN PATENT DOCUMENTS

| | | |
|---|---|---|
| EP | 1 845 132 A2 | 10/2007 |
| EP | 2063319 A1 * | 5/2009 |
| EP | 2 172 808 A1 | 4/2010 |
| EP | 2 302 422 A1 | 3/2011 |
| JP | A-05-291208 | 11/1993 |
| JP | A-06-095385 | 4/1994 |
| JP | A-07-181688 | 7/1995 |
| JP | A-07-183194 | 7/1995 |
| JP | A-11-060735 | 3/1999 |
| JP | A-2003-084438 | 3/2003 |
| JP | A-2004-153125 | 5/2004 |
| JP | A-2004-349572 | 12/2004 |
| JP | A-2005-015779 | 1/2005 |
| JP | A-2005-128509 | 5/2005 |
| JP | A-2005-520354 | 7/2005 |
| JP | A-2009-126940 | 6/2009 |
| JP | A-2010-519596 | 6/2010 |
| WO | WO 2008/106379 A1 | 9/2008 |
| WO | WO 2010/007900 A1 | 1/2010 |

OTHER PUBLICATIONS

European Search Report dated Jan. 6, 2012 issued in European Patent Application No. 11006702.2.
Dec. 18, 2012 Notification of Reasons for Refusal issued in Japanese Application No. 2010-195379 with partial English-language translation.

* cited by examiner

Primary Examiner — Amanda C. Walke
(74) Attorney, Agent, or Firm — Oliff & Berridge, PLC

(57) ABSTRACT

A thermosetting silicon-containing film-forming composition for forming a silicon-containing film to be formed in a multi-layer resist process used in lithography, the composition including at least: (A) a silicon-containing compound obtained by hydrolysis-condensation of a hydrolyzable silicon compound and compound(s) selected from the group consisting of a hydrolyzable silicon compound and a reactive compound; (B) a thermal crosslinking accelerator; (C) an organic acid with one, or two or more valency having 1 to 30 carbon atoms; and (D) an organic solvent.

14 Claims, No Drawings

SILICON-CONTAINING FILM-FORMING COMPOSITION, SILICON-CONTAINING FILM-FORMED SUBSTRATE, AND PATTERNING PROCESS

BACKGROUND OF THE INVENTION

1. Field of the Invention

Present invention relates to; a silicon-containing film used as an intermediate layer in a multi-layer resist process used in microprocessing in manufacturing of a semiconductor element and the like, especially a silicon-containing film-forming composition that is suitable to form an intermediate layer by a spin coating method; a silicon-containing film-formed substrate; and a patterning process using this.

2. Description of the Related Art

With highly integrated LSI's providing highly increased speeds, finer pattern rules are being rapidly promoted. Commensurately with the fineness, the lithography technique has attained formation of fine patterns, by virtue of light sources of shorter wavelengths and resist compositions appropriately selected therefor. The main role thereof was played by positive photoresist compositions to be each used as a monolayer. The monolayer positive photoresist composition is configured to possess, in a resist resin, a frame having an etching resistance against dry etching by chlorine-based or fluorine-based gas plasma, and to possess such a resist mechanism that an exposed area is made dissolvable, so that the exposed area is dissolved to thereby form a pattern, and the remaining resist pattern is used as an etching mask to dry etch a processing substrate coated with the resist composition.

However, when a pattern is made finer, i.e., pattern rules are further narrowed while keeping a thickness of a used photoresist film as it is, the photoresist film is deteriorated in resolution performance. Further, when the resist film is to be developed by a developer to form a pattern, a so-called aspect ratio thereof is made excessively large, thereby resultingly causing a pattern collapse. Thus, the fineness has been accompanied by decrease in photoresist film thickness.

Meanwhile, although for processing of a processing substrate, there is typically used a method for processing the processing substrate by dry etching by adopting a patterned photoresist film as an etching mask, practically no dry etching methods exist to exhibit a complete etching selectivity between a photoresist film and a processing substrate, so that the resist film is also damaged during processing of the processing substrate and the resist film is collapsed, thereby failing to accurately transfer a resist pattern onto the processing substrate. Thus, with finer patterns, resist compositions have been required to have higher dry etching resistances.

Further, since shortened wavelengths of exposure have demanded that resins having lower light absorption at exposure wavelengths are used for photoresist compositions, such resins have been subjected to a transitional history from a novolak resin, through polyhydroxystyrene, and to a resin having an aliphatic polycyclic frame, commensurately with a transitional history from i-beam, through KrF, and to ArF. However, etching speeds under the dry etching condition have been practically made higher, so that recent photoresist compositions having higher resolutions practically tend to be rather lowered in etching resistance.

This obliges a processing substrate to be dry etched by a photoresist film which is inevitably thinner and weaker in etching resistance, thereby making it urgent to ensure a material and a process in this processing state.

As one method to solve such a problem, multi-layer resist process have been used. The methods are configured to: interpose a resist intermediate film having an etching selectivity different from that of a photoresist film, i.e., a resist upper layer film, between the resist upper layer film and a processing substrate; obtain a pattern in the resist upper layer film; thereafter transfer the pattern to the resist intermediate film by dry etching by using the obtained resist upper layer film pattern as a dry etching mask; and further transfer the pattern onto the processing substrate by dry etching by using the obtained pattern of the intermediate film as a dry etching mask.

In a bilayer resist process as one of the multi-layer resist processes, a silicon-containing resin is used as a resist composition of a upper layer film, and a novolak resin is used as an intermediate film (Japanese Patent Laid-Open (kokai) No. H6-95385, for example). The silicon resin exhibits an excellent etching resistance against reactive dry etching by oxygen plasma, but is easily etched and removed by using fluorine-based gas plasma. In turn, the novolak resin is easily etched and removed by reactive dry etching by oxygen gas plasma, but exhibits an excellent etching resistance against dry etching by fluorine-based gas plasma, chlorine-based gas plasma, or the like. Thus, a novolak resin film as a resist intermediate film is formed on a processing substrate, and a resist upper layer film adopting a silicon-containing resin is formed thereon. Next, the silicon-containing resist film is subjected to pattern formation by a post treatment such as irradiation of energy beam, development, and the like, and the formed pattern is used as a dry etching mask in a manner to remove a novolak resin by reactive dry etching based on oxygen plasma at those portions of the novolak resin where the resist pattern material has been developedly removed, to thereby transfer the pattern to the novolak film. Further, the pattern transferred to the novolak film is used as a dry etching mask, thereby enabling pattern transference to the processing substrate by etching based on fluorine-based gas plasma, chlorine-based gas plasma, or the like.

Since such a pattern transference based on dry etching leads to obtainment of a transferred pattern in a relatively excellent profile when an etching resistance of the etching mask is sufficient, problems are scarcely caused such as pattern collapse due to friction or the like by a developer upon development of a resist, thereby allowing for obtainment of a pattern having a relatively large aspect ratio. Thus, even for a fine pattern which has not been directly formed due to pattern collapse upon development or the like due to a problem of aspect ratio when a resist film exemplarily adopting a novolak resin has been made to have a thickness corresponding to that of the aforementioned intermediate film, the above-described bilayer resist process allows for obtainment of such a novolak resin pattern having a sufficient thickness as a dry etching mask of a processing substrate.

The multi-layer resist process further include a three-layer resist process which can be performed by using a typical resist composition used in a monolayer resist process. For example, this method is configured to form: an organic film as a resist lower layer film based on novolak or the like on a processing substrate; a silicon-containing film as a resist intermediate film, thereon; and a typical organic photoresist film as a resist upper layer film, thereon. Since the organic resist upper layer film exhibits an excellent etching selectivity ratio relative to the silicon-containing resist intermediate film for dry etching by fluorine-based gas plasma, the resist pattern is transferred to the silicon-containing resist intermediate film by means of dry etching based on fluorine-based gas plasma. According to this method, patterns of novolak films having sufficient dry etching resistances for processing can be obtained similarly to the bilayer resist process insofar as patterns can be transferred to silicon-containing films, even by adopting: a resist composition which is difficult to be formed with a pattern having a sufficient film thickness for direct processing of a processing substrate; and a resist composition having an insufficient dry etching resistance for processing of a substrate.

Examples of silicon-containing resist intermediate films to be used in the above-described three-layer resist process include silicon-containing inorganic films by CVD, such as $SiO_2$ films (Japanese Patent Laid-Open (kokai) No. H7-183194, for example) and SiON films (Japanese Patent Laid-Open (kokai) No. H7-181688, for example); and films obtained by spin coating, such as SOG (spin-on-glass) films (Japanese Patent Laid-Open (kokai) No. H5-291208, for example), and crosslinkable silsesquioxane films (Japanese translation of PCT international application No. 2005-520354, for example); and polysilane films (Japanese Patent Laid-Open (kokai) No, H11-60735, for example) would also be usable. Although the $SiO_2$ films and SiON films have excellent performances as a dry etching mask upon dry etching of an underlying organic film, a specific equipment is required for film-formation. Contrary, the SOG films, crosslinkable silsesquioxane films, and polysilane films can be formed by only spin coating and heating, and are thus considered to be high in process efficiency.

The applicability of the multi-layer resist process is not restricted to an attempt to enhance a resolution limit of resist film. In a via-first method which is one of substrate processing methods where a processing intermediate substrate has large height differences, an attempt to form a pattern with a single resist film encounters a problem such as inaccurate focusing during resist exposure due to a substantial difference in resist film thickness. In such a case, the height differences are filled by a sacrificial, film and flattened thereby, then a resist film is formed thereon and a resist pattern is formed, and this situation inevitably entails usage of the aforementioned multi-layer resist process (Japanese Patent Laid-Open (kokai) No. 2004-349572, for example).

Silicon-containing films having been conventionally used in such a multi-layer resist process have several problems. For example, it is well known that when a resist pattern is intended be formed by photolithography, exposure light is reflected by a substrate and interferes with incident light, to cause a problem of so-called standing waves, and it is required to interposingly provide an antireflective film as an intermediate film so as to obtain a fine pattern which is free of edge roughness of photoresist film. Particularly, reflection control is indispensable, under the most-advanced high NA exposure conditions.

Then, it becomes necessary to interpose an organic antireflective film between a silicon-containing film and a photoresist film to be formed on the silicon-containing film, in a process for forming the silicon-containing film as a resist intermediate film, particularly by CVD in a multi-layer resist process. However, when such an organic antireflective film is to be additionally interposed, it becomes necessary to pattern the organic antireflective film by using the photoresist film as a dry etching mask, such that transference to processing of the silicon-containing film is allowed after dry etching of the organic antireflective film by using the photoresist film as the mask upon dry etching. As such, the overlying photoresist film is subjected to an additional burden of dry etching to an extent the processing of the organic antireflective film. Particularly, most-advanced photoresist films have been made small in thickness, so that such dry etching burden is not negligible. Thus, attention has been directed to a three-layer resist process utilizing a light-absorbing silicon-containing film as a resist intermediate film which is free of occurrence of the aforementioned etching burden.

As the light-absorbing silicon-containing intermediate film, a light-absorbing silicon-containing intermediate film of a spin coating type has been known. For example, a technique in which an aromatic structure is used as a light-absorbing structure is disclosed (Japanese Patent Laid-Open (kokai) No. 2005-15779, for example). However, an aromatic ring structure, which absorbs a light efficiently, has an effect to decrease a dry etching rate in dry etching process by a fluorin-based gas plasma; and thus, this technique is to a unfavorable direction in carrying out dry etching of an intermediate film without a load to a photoresist film. Accordingly, when this kind of the light-absorbing substituent group is added, an appropriate dry etching process is prioritized, and a measure is taken in a direction to lower the light-absorption efficiency by regulating amount of the light-absorbing substituent group or by decreasing thickness of the intermediate film; and thus, this leads to decrease in an antireflection function thereby adversely affecting a lithography process.

Accordingly, a material with a low load, especially to a upperlayer photoresist film in a dry etching process, while having an adequate antireflection function, has been desired.

SUMMARY OF THE INVENTION

The present invention has been made in view of the situation as mentioned above, and has an object to provide a thermosetting silicon-containing film-forming composition, wherein, in a multi-layer resist process used in lithography, the composition is:

(1) capable of forming an excellent pattern with suppressed reflection even under a high NA exposure condition upon formation of a resist pattern subsequently after formation of a photoresist film onto a silicon-containing film formed on an organic film, (2) capable of forming a silicon-containing film usable as an excellent dry etching mask between the photoresist film that is an upperlayer film of the silicon-containing film and the organic film that is an underlayer film thereof, and (3) excellent in etching selectivity to the upperlayer photoresist.

In order to solve the foregoing problems, the present invention provides a thermosetting silicon-containing film-forming composition for forming a silicon-containing film to be formed in a multi-layer resist process used in lithography, wherein the composition comprises at least:

(A) a silicon-containing compound obtained by hydrolysis-condensation of
one, or two or more kinds of a hydrolyzable silicon compound represented by the following general formula (1) and one, or two or more compounds selected from the group consisting of a hydrolyzable silicon compound represented by the following general formula (2-1) and a reactive compound represented by the following general formula (2-2), $$R^1_{m1}Si(OR^2)_{(4-m1)} \tag{1}$$

$$R^3_{m3}Si(OR^4)_{(4-m3)} \tag{2-1}$$

$$U(OR^5)_{m5}(OR^6)_{m6}(O)_{m7/2} \tag{2-2}$$

wherein $R^1$ represents a monovalent organic group substituted with one or more fluorine atoms and having 1 to 30 carbon atoms; $R^3$ represents a hydrogen atom or a monovalent organic group having 1 to 30 carbon atoms, wherein $R^1$ and $R^3$ may be the same or different with each other; $R^2$ and $R^4$ represent an alkyl group having 1 to 6 carbon atoms; m1 and m3 are integers satisfying m1≦3 and 0≦m3≦3, respectively; $R^5$ and $R^6$ represent an organic group having 1 to 30 carbon atoms; m5+m6+m7/2 is a valency determined by the kind of U; each of m5, m6, and m7 is an integer of 0 or more; and U is any element belonging to the groups of III, IV, or V in the periodic table, except for carbon and silicon, (B) one, or two or more kinds of a thermal crosslinking accelerator represented by the following general formula (3) or (4),

$$L_a H_b X \quad (3)$$

wherein L represents any of lithium, sodium, potassium, rubidium, and cesium; X represents a hydroxyl group or an organic acid group with one, or two or more valency having 1 to 30 carbon atoms; a represents an integer of 1 or more, b represents 0 or an integer of 1 or more, and a+b is a valency of the hydroxyl group or the organic acid group,

$$M_a H_{b'} A \quad (4)$$

wherein M represents any of a sulfonium group, an iodonium group, and an ammonium group; A represents a hydroxyl group, or an organic acid group with one, or two or more valency having 1 to 30 carbon atoms, or an non-nucleophilic counter ion; a' represents an integer of 1 or more, b' represents 0 or an integer of 1 or more, and a'+b' is a valency of the hydroxyl group, the organic acid group, or the non-nucleophilic counter ion, (C) an organic acid with one, or two or more valency having 1 to 30 carbon atoms, and (D) an organic solvent.

Accordingly, when the thermosetting silicon-containing film-forming composition of the present invention is used in a multi-layer resist process used in lithography, reflection can be suppressed, even under high NA exposure with any of dry and immersion conditions, upon formation of a resist pattern subsequently after formation of a photoresist film onto a silicon-containing film that is formed on an organic film; and thus, excellent patterning is possible. Further, a silicon-containing film usable as an excellent dry etching mask can be formed between the photoresist film that is an upperlayer film of the silicon-containing film and the organic film that is an underlayer film thereof, and in addition, etching selectivity especially to the upperlayer photoresist is excellent; and thus, deformation of the upperlayer resist can be suppressed during dry etching of the silicon-containing film.

The silicon-containing compound of the foregoing component (A) can be a compound obtained by hydrolysis-condensation using an acid as a catalyst.

In the present invention, the acid is used as a hydrolytic condensation catalyst to obtain the silicon-containing compound (A), thereby enabling obtainment of a silicon-containing film-forming composition having an excellent storage stability and having lithographic characteristics at the same level as typical organic antireflective films.

The foregoing acid catalyst is preferably one or more compounds selected from inorganic acids and sulfonic acid derivatives.

Accordingly, when one or more compounds selected from inorganic acids and sulfonic acid derivatives is used as the acid catalyst in hydrolysis-condensation, storage stability can be improved further.

In addition, M in the general formula (4) is preferably any of a tertiary sulfonium, a secondary iodonium, and a quaternary ammonium.

In this way, when the silicon-containing film (cured film) is formed by adopting the component (B) where M in the general formula (4) is any of a tertiary sulfonium, secondary iodonium, and quaternary ammonium, it becomes possible to provide a film which has been progressed in cross-linking. Thus, active constituents in the resist film formed on the silicon-containing film are prevented from migrating to the silicon-containing film, thereby allowing to obtain a lithography performance at the same level as typical organic antireflective films, to obtain an excellent resist film pattern.

In addition, U in the general formula (2-2) is preferably any of boron, aluminum, gallium, yttrium, germanium, titanium, zirconium, hafnium, bismuth, tin, phosphorous, vanadium, arsenic, antimony, niobium, and tantalum.

The silicon-containing film including the element represented by the U exhibits an etching speed faster than that of a silicon-containing film without containing the U, and is capable of forming an intermediate film which allows for pattern transference thereto even by adopting a thinned photoresist film as an etching mask.

The present invention provides a substrate, wherein the substrate is formed of successively at least an organic film formed on a processing substrate, a silicon-containing film formed on the organic film by using the thermosetting silicon-containing film-forming composition, and a photoresist film formed on the silicon-containing film.

In this way, by using a substrate formed thereon with a three-layered resist film comprising an organic film, a silicon-containing film formed from the thermosetting silicon-containing film-forming composition of the present invention, and a photoresist film in a manner to form a pattern on the substrate by lithography, the formed pattern can be made fine with a higher precision.

Further in addition, the present invention provides a patterning process for forming a pattern on a substrate, wherein the patterning process is effected by at least:

forming an organic film on a processing substrate, forming a silicon-containing film on the organic film by using the thermosetting silicon-containing film-forming composition, forming a resist film on the silicon-containing film by using a resist composition of a chemically amplification type not containing silicon, after exposure of the resist film and then alkaline development, pattern-processing of the silicon-containing film by dry etching by using the obtained resist film pattern as an etching mask, pattern-processing of the underlayer organic film by using the processed silicon-containing film pattern as an etching mask, and pattern-processing of the processing substrate by using the processed organic film as an etching mask to form a pattern on a substrate.

The patterning process using such a multilayer resist process enables formation of a fine pattern on a substrate with a higher precision.

In patterning of the resist film, a photo lithography method in which a light having wavelength of 300 nm or shorter or an EUV light may be used, or an electron beam drawing method may be used.

In this way, by forming a pattern by lithography adopting light having a wavelength of 300 nm or shorter, particularly ArF excimer laser, immersion ArF exicmer laser, or an EUV light, or by an electron beam drawing method, the formed pattern can be made fine with a higher precision.

As mentioned above, when the silicon-containing film formed by using the thermosetting silicon-containing film-forming composition of the present invention, excellent patterning of the photoresist film formed thereon can be effected. In addition, high etching selectivity with an organic material;

and thus, the formed photoresist pattern can be transferred to the silicon-containing intermediate film, and then to the organic underlayer film successively by a dry etching process. Especially as microprocessing of a semiconductor process advances, film thickness of the photoresist becomes thinner and thereby pattern transfer to conventional silicon-containing film becomes difficult; however, when the thermosetting silicon-containing film-forming composition of the present invention is used, even if a thinned photoresist is used as an etching mask, deformation of the photoresist pattern during dry etching can be suppressed; and thus, this pattern can be transferred to the substrate with high precision.

DETAILED DESCRIPTION OF THE PREFERRED EMBODIMENTS

In the following, the present invention will be explained in detail. However, the present invention is not limited thereto.

As mentioned above, the silicon-containing film used in a multi-layer resist process is requested to have an adequate anti-reflection function and a less load especially to the upper-layer photoresist film in a dry etching process; and thus, a material that can form such a silicon-containing film (silicon-containing film-forming composition) has been desired.

Accordingly, inventors of the present invention investigated extensively on lithography properties and stability of a silicon-containing film-forming composition, and found, when a following silicon-containing compound (A) obtained by hydrolysis-condensation of a hydrolyzable silicon compound is blended with following components (B), (C), and (D), that:
(1) a silicon-containing film capable of suppressing reflection under high NA exposure with any of dry and immersion conditions could be obtained,
(2) a silicon-containing film having adequate etching selectivity as a dry etching mask could be obtained, and
(3) etching selectivity especially to an upperlayer resist and an intermediate film could be improved; and as a result, the present invention could be accomplished.

Namely, the thermosetting silicon-containing intermediate film-forming composition of the present invention is a thermosetting silicon-containing film-forming composition for forming a silicon-containing film to be formed in a multi-layer resist process used in lithography, wherein the composition comprises at least:
(A) a silicon-containing compound obtained by hydrolysis-condensation of one, or two or more kinds of a hydrolyzable silicon compound represented by the following general formula (1) and one, or two or more compounds selected from the group consisting of a hydrolyzable silicon compound represented by the following general formula (2-1) and a reactive compound represented by the following general formula (2-2), $$R^1{}_{m1}Si(OR^2)_{(4-m1)} \tag{1}$$

$$R^3{}_{m3}Si(OR^4)_{(4-m3)} \tag{2-1}$$

$$U(OR^5)_{m5}(OR^6)_{m6}(O)_{m7/2} \tag{2-2}$$

wherein $R^1$ represents a monovalent organic group substituted with one or more fluorine atoms and having 1 to 30 carbon atoms; $R^3$ represents a hydrogen atom or a monovalent organic group having 1 to 30 carbon atoms, wherein $R^1$ and $R^3$ may be the same or different with each other; $R^2$ and $R^4$ represent an alkyl group having 1 to 6 carbon atoms; and m1 and m3 are integers satisfying m1≦3 and 0≦m3≦3, respectively; $R^5$ and $R^6$ represent an organic group having 1 to 30 carbon atoms; m5+m6+m7/2 is a valency determined by the kind of U; each of m5, m6, and m7 is an integer of 0 or more; and U is any element belonging to the groups of III, IV, or V in the periodic table, except for carbon and silicon,
(B) one, or two or more kinds of a thermal crosslinking accelerator represented by the following general formula (3) or (4), $$L_aH_bX \tag{3}$$

wherein L represents any of lithium, sodium, potassium, rubidium, and cesium; X represents a hydroxyl group or an organic acid group with one, or two or more valency having 1 to 30 carbon atoms; a represents an integer of 1 or more, b represents 0 or an integer of 1 or more, and a+b is a valency of the hydroxyl group or the organic acid group, $$M_aH_bA \tag{4}$$

wherein M represents any of a sulfonium group, an iodonium group, and an ammonium group; A represents a hydroxyl group, or an organic acid group with one, or two or more valency having 1 to 30 carbon atoms, or an non-nucleophilic counter ion; a' represents an integer of 1 or more, b' represents 0 or an integer of 1 or more, and a'+b' is a valency of the hydroxyl group, the organic acid group, or the non-nucleophilic counter ion,
(C) an organic acid with one, or two or more valency having 1 to 30 carbon atoms, and
(D) an organic solvent.

As mentioned above, the thermosetting silicon-containing film-forming composition of the present invention contains a fluorine atom(s) that can enhance reflective index; and thus, the silicon-containing film formed from the composition of the present invention can be provided with an anti-reflection function.

In addition, a fluorine atom in the silicon-containing film acts to the silicon-containing film as an active species of a radical, an ion, and the like during dry etching process thereby leading to acceleration of processing by a dry etching gas; as a result, higher etching selectivity especially to the upperlayer photoresist, too, than a heretofore known material can be obtained.

Hereinbelow, explanation will be made on embodiments of the present invention more specifically; but the present invention is not restricted to these embodiments.

In the thermosetting silicon-containing film-forming composition of the present invention, the silicon-containing compound (A) used in the present invention can be obtained by hydrolysis-condensation of hydrolyzable compounds represented by the following general formulae.

$$R^1{}_{m1}Si(OR^2)_{(4-m1)} \tag{1}$$

$$R^3{}_{m3}Si(OR^4)_{(4-m3)} \tag{2-1}$$

$$U(OR^5)_{m5}(OR^6)_{m6}(O)_{m7/2} \tag{2-2}$$

(Wherein $R^1$ represents a monovalent organic group substituted with one or more fluorine atoms and having 1 to 30 carbon atoms; $R^3$ represents a hydrogen atom or a monovalent organic group having 1 to 30 carbon atoms, wherein $R^1$ and $R^3$ may be the same or different with each other; $R^2$ and $R^4$ represent an alkyl group having 1 to 6 carbon atoms; m1 and m3 are integers satisfying m1≦3 and 0≦m3≦3, respectively; $R^5$ and $R^6$ represent an organic group having 1 to 30 carbon atoms; m5+m6+m7/2 is a valency determined by the kind of U; each of m5, m6, and m7 is an integer of 0 or more; and U is any element belonging to the groups of III, IV, or V in the periodic table, except for carbon and silicon.)

Herein, the term "organic group" means a group, which includes carbon, and which may additionally include hydrogen, as well as nitrogen, oxygen, sulfur, silicon or the like.

Examples of the monovalent organic group $R^1$ and $R^3$ having 1 to 30 carbon atoms includes a monovalent hydrocarbon group, such as a linear, a branched, or a cyclic alkyl group, an alkenyl group, an alkynyl group, an aryl group, or an aralkyl group.

Note that $R^1$ is these exemplified organic group whose one or more hydrogen atoms is substituted with a fluorine atom (the same is applied hereinafter).

In addition, other examples of the organic groups represented by $R^1$ and $R^3$ include groups including intramolecular intervening groups such as —O—, —CO—, —OCO—, —COO—, or —OCOO—, i.e., organic groups having one or more carbon-oxygen single bonds or carbon-oxygen double bonds. Concrete examples include organic groups having one or more groups selected from a group consisting of epoxy, ester, alkoxyl, and hydroxyl groups. Examples of such organic groups having one or more carbon-oxygen single bonds or carbon-oxygen double bonds include those represented by the following general formula (6).

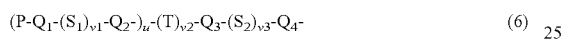
(6)

(Wherein P is a hydrogen atom, hydroxyl group,

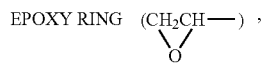

an alkoxyl group having 1 to 4 carbon atoms, alkylcarbonyloxy group having 1 to 6 carbon atoms, or alkylcarbonyl group having 1 to 6 carbon atoms;

$Q_1$, $Q_2$, $Q_3$, and $Q_4$ are independently —$C_qH_{(2q-p)}P_p$— (wherein P is the same as the above, p is an integer of 0 to 3, and q is an integer of 0 to 10 (q=0 represents a single bond));

u is an integer of 0 to 3;

$S_1$ and $S_2$ independently represent —O—, —CO—, —COO—, —COO—, or —OCOO—; and v1, v2, and v3 independently represent 0 or 1.

Simultaneously with the above, T is a divalent group comprising an alicycle or aromatic ring which may contain a heteroatom, and examples of alicycles or aromatic rings of T which may include a heteroatom such as oxygen atoms in T are listed below. Those sites of T which are bonded to $Q_2$ and $Q_3$ are not particularly limited, and such sites may be appropriately selected in view of reactivities based on steric factors and availabilities of commercial reagents to be used in the reaction.)

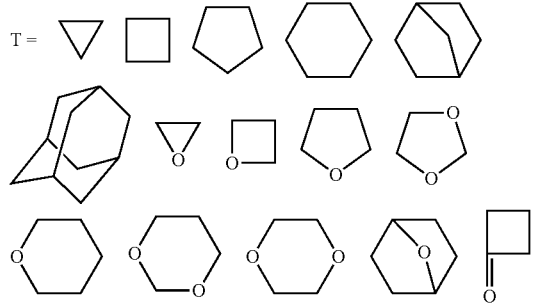

Preferable examples of organic groups having one or more carbon-oxygen single bonds or carbon-oxygen double bonds, include the following. Note that the following formulae include a symbol "(Si)" depicted to show a bonding site to Si.

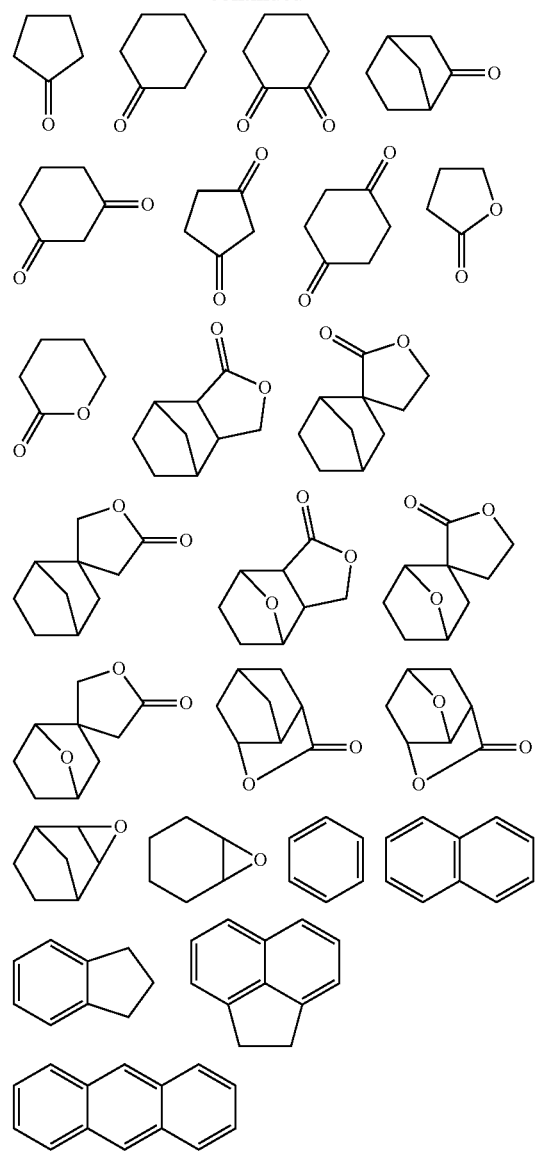

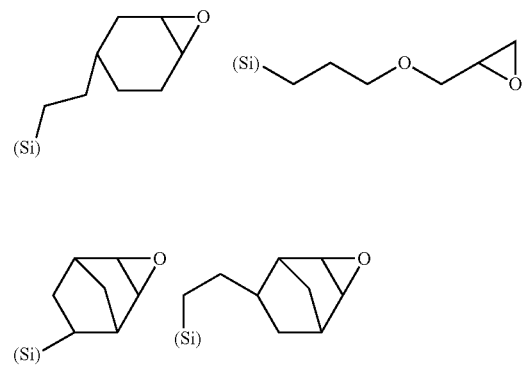

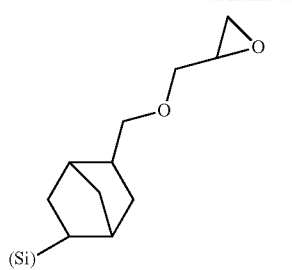
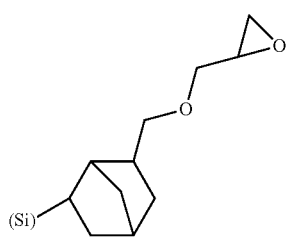
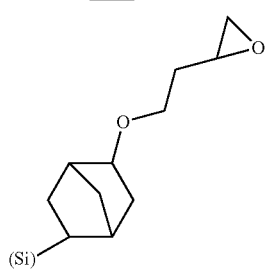
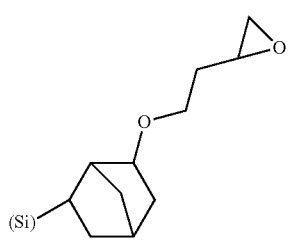
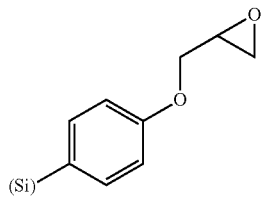
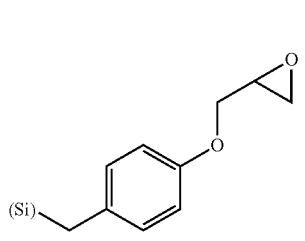
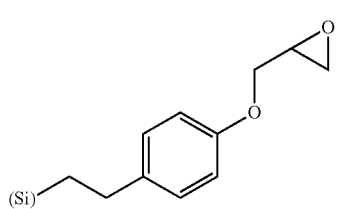
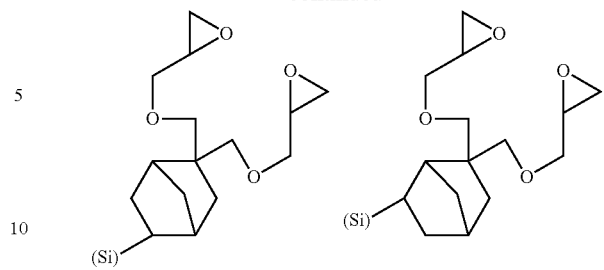
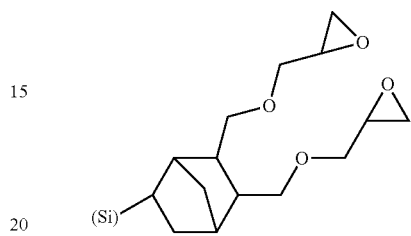
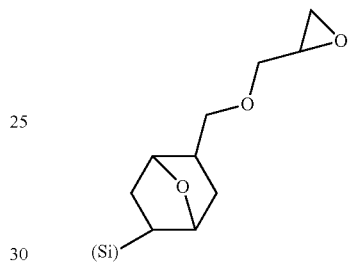
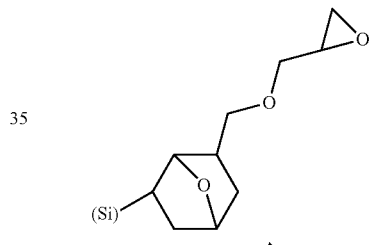
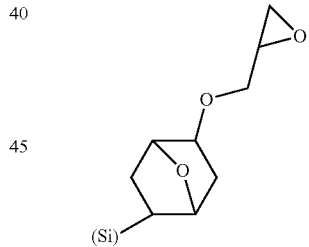
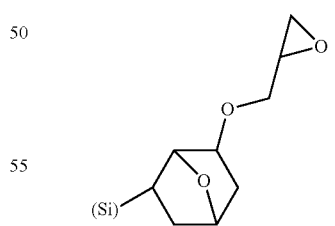
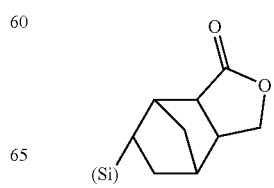
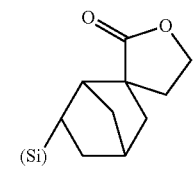

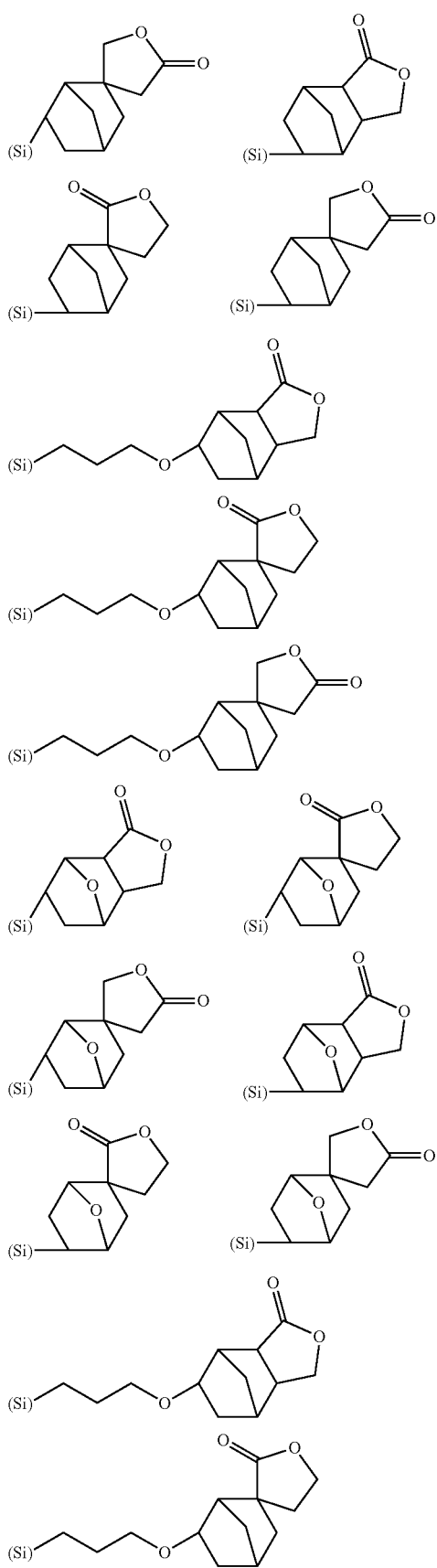
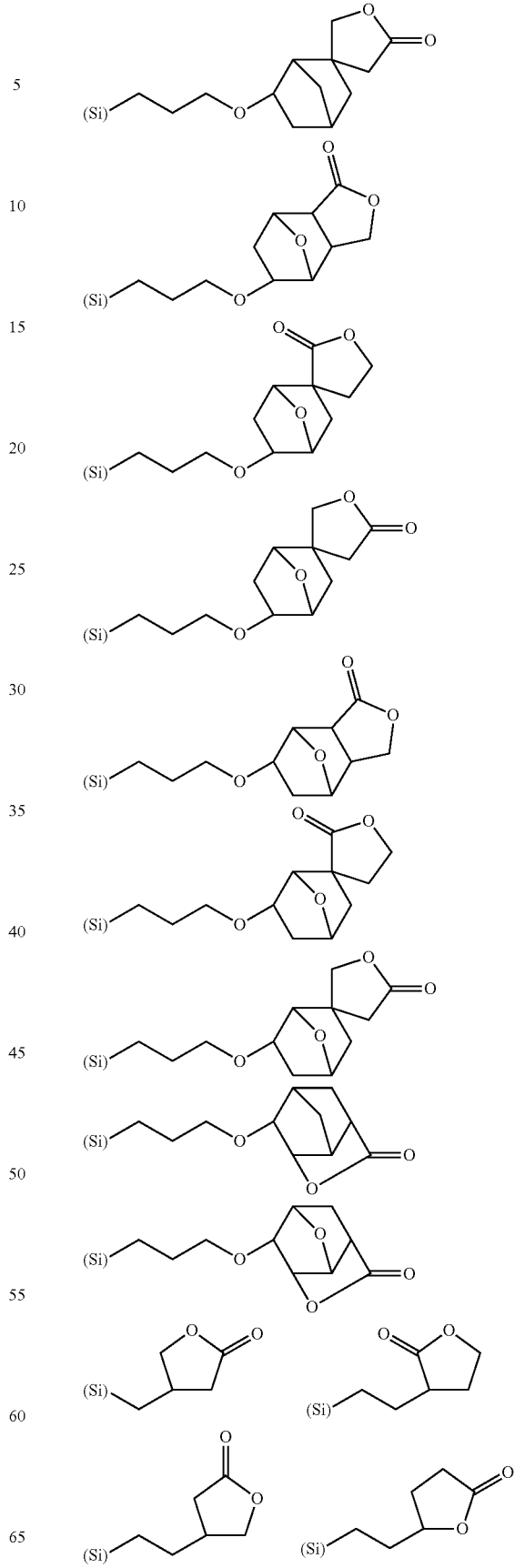

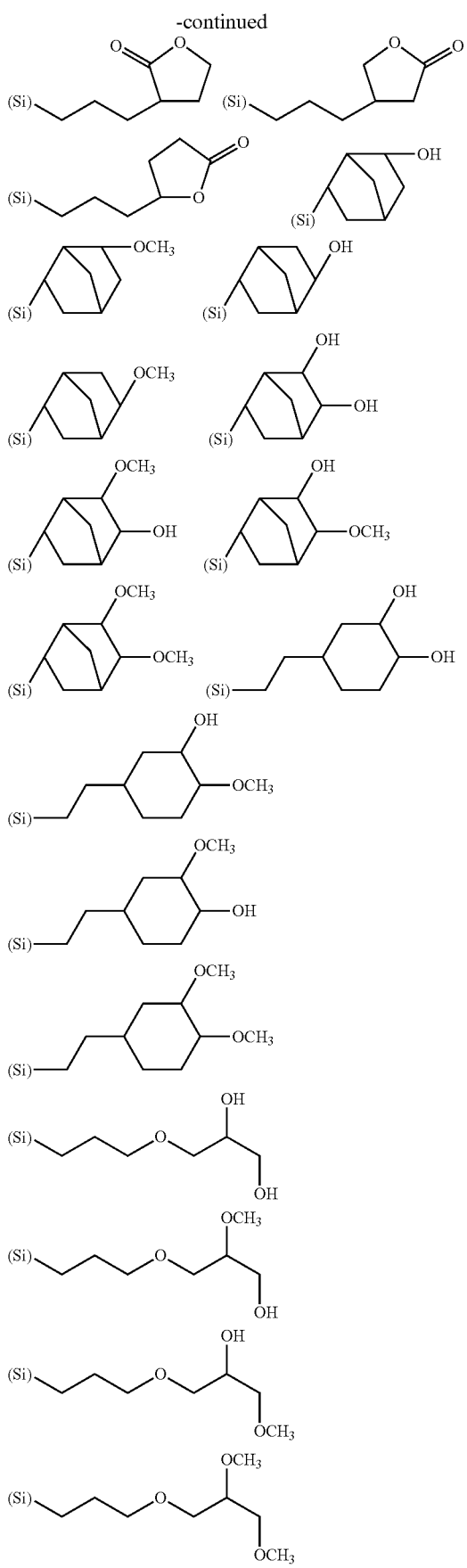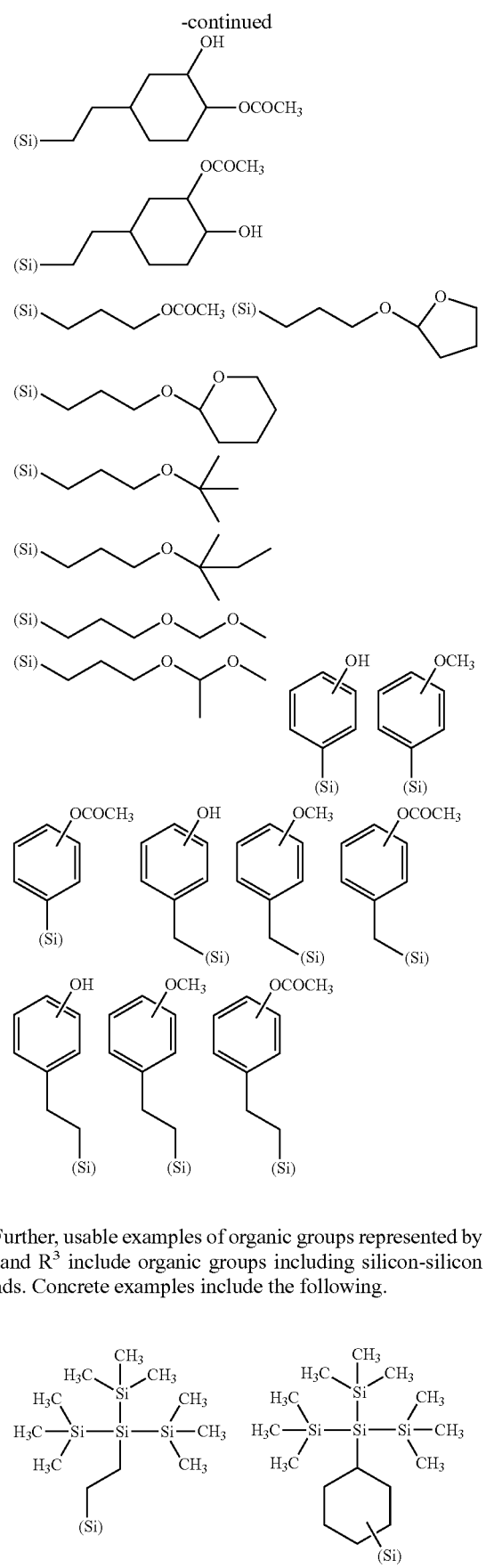
Further, usable examples of organic groups represented by $R^1$ and $R^3$ include organic groups including silicon-silicon bonds. Concrete examples include the following.
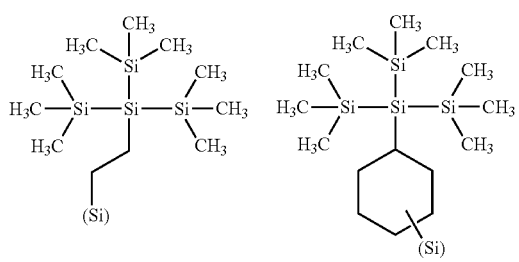

-continued

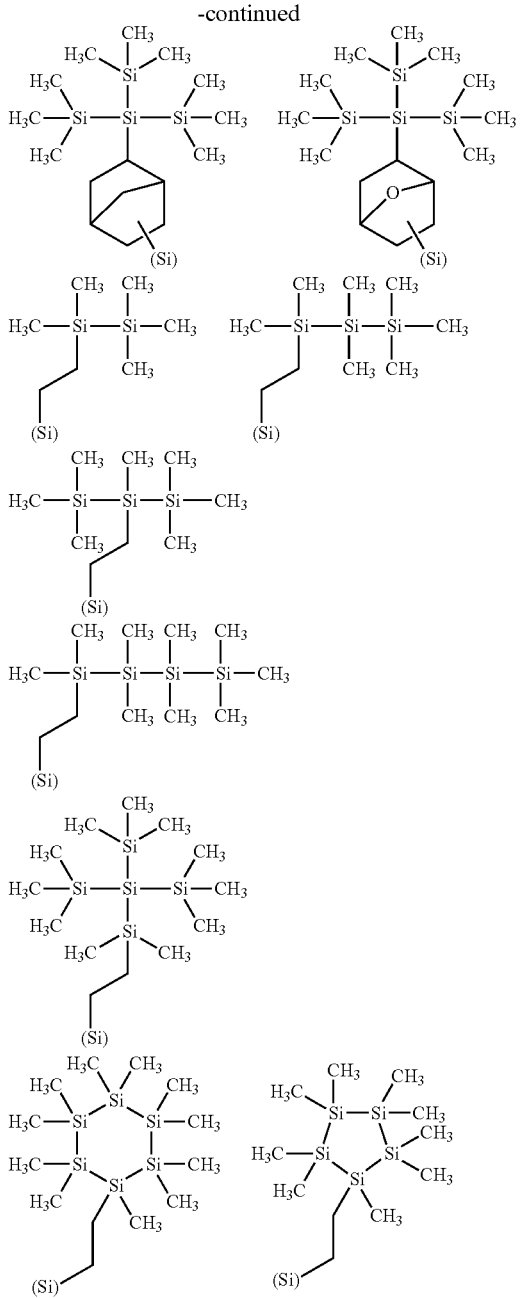

Suitable as $R^1$ and $R^3$ are: alkyl groups such as methyl, ethyl, n-propyl, iso-propyl, n-butyl, iso-butyl, sec-butyl, t-butyl, n-pentyl, 2-ethylbutyl, 3-ethylbutyl, 2,2-diethylpropyl, cyclopentyl, n-hexyl, and cyclohexyl groups; alkenyl groups such as vinyl and allyl groups; alkynyl groups such as ethynyl group; and, as light-absorbing groups, aryl groups such as phenyl and tolyl groups, and aralkyl groups such as benzyl and phenethyl groups. As preferable $R^3$, a hydrogen atom can be mentioned, too.

In the case that an anti-reflection function of the silicon-containing film formed by the thermosetting silicon-containing film-forming composition of the present invention is intended to be enhanced, an light-absorbing group including an aryl group such as a phenyl group and a tolyl group, an aralkyl group such as a benzyl group and a phenethyl group, and an organic group having a silicon-silicon bond can be mentioned as preferable $R^1$ and $R^3$.

Concrete examples of the alkyl group having 1 to 6 carbon atoms $R^2$ and $R^4$ include methyl, ethyl, n-propyl, iso-propyl, n-butyl, iso-butyl, sec-butyl, tert-butyl, n-pentyl, cyclopentyl, n-hexyl, cyclohexyl, and phenyl groups.

Examples of $R^5$ and $R^6$ include: unsubstituted monovalent hydrocarbon groups, such as linear, branched or cyclic alkyl, alkenyl, aryl and aralkyl groups; substituted groups, which one or more hydrogen atoms of the above groups is substituted with an epoxy group, alkoxyl group, hydroxyl group, or the like; and groups including intramolecular intervening groups such as —O—, —CO—, —COO—, —COO—, and —OCOO—.

U is an element belonging to group III, group IV or group V in the periodic table, except for carbon and silicon; and preferable for the present invention is any of boron, aluminum, gallium, yttrium, germanium, titanium, zirconium, hafnium, bismuth, tin, phosphorus, vanadium, arsenic, antimony, niobium, and tantalum.

Examples of the compounds represented by the general formula (1) include the following, without limited thereto. Note that $R^2$ is the same as the above.

$CF_3CH_2CH_2$—$Si(OR^2)_3$    $CF_3CH_2CH_2$—$SiCH_3(OR^2)_2$ $CF_3CH_2CH_2$—$Si(CH_3)_2OR^2$    $CF_3CF_2CH_2CH_2$—$Si(OR^2)_3$ $CF_3CF_2CH_2CH_2$—$SiCH_3(OR^2)_2$  $CF_3CF_2CH_2CH_2$—$Si(CH_3)_2OR^2$ $CF_3(CF_2)_2CH_2CH_2$—$Si(OR^2)_3$ $CF_3(CF_2)_2CH_2CH_2$—$SiCH_3(OR^2)_2$ $CF_3(CF_2)_2CH_2CH_2$—$Si(CH_3)_2OR^2$ $CF_3(CF_2)_3CH_2CH_2$—$Si(OR^2)_3$ $CF_3(CF_2)_3CH_2CH_2$—$SiCH_3(OR^2)_2$ $CF_3(CF_2)_3CH_2CH_2$—$Si(CH_3)_2OR^2$ $CF_3(CF_2)_4CH_2CH_2$—$Si(OR^2)_3$ $CF_3(CF_2)_4CH_2CH_2$—$SiCH_3(OR^2)_2$ $CF_3(CF_2)_4CH_2CH_2$—$Si(CH_3)_2OR^2$ $CF_3(CF_2)_5CH_2CH_2$—$Si(OR^2)_3$ $CF_3(CF_2)_5CH_2CH_2$—$SiCH_3(OR^2)_2$ $CF_3(CF_2)_5CH_2CH_2$—$Si(CH_3)_2OR^2$ $CF_3(CF_2)_6CH_2CH_2$—$Si(OR^2)_3$ $CF_3(CF_2)_6CH_2CH_2$—$SiCH_3(OR^2)_2$ $CF_3(CF_2)_6CH_2CH_2$—$Si(CH_3)_2OR^2$ $CF_3(CF_2)_7CH_2CH_2$—$Si(OR^2)_3$ $CF_3(CF_2)_7CH_2CH_2$—$SiCH_3(OR^2)_2$ $CF_3(CF_2)_7CH_2CH_2$—$Si(CH_3)_2OR^2$ $(F_3C)_2CFOCH_2CH_2CH_2$—$Si(OR^2)_3$ $(F_3C)_2CFOCH_2CH_2CH_2$—$SiCH_3(OR^2)_2$ $(F_3C)_2CFOCH_2CH_2CH_2$—$Si(CH_3)_2OR^2$

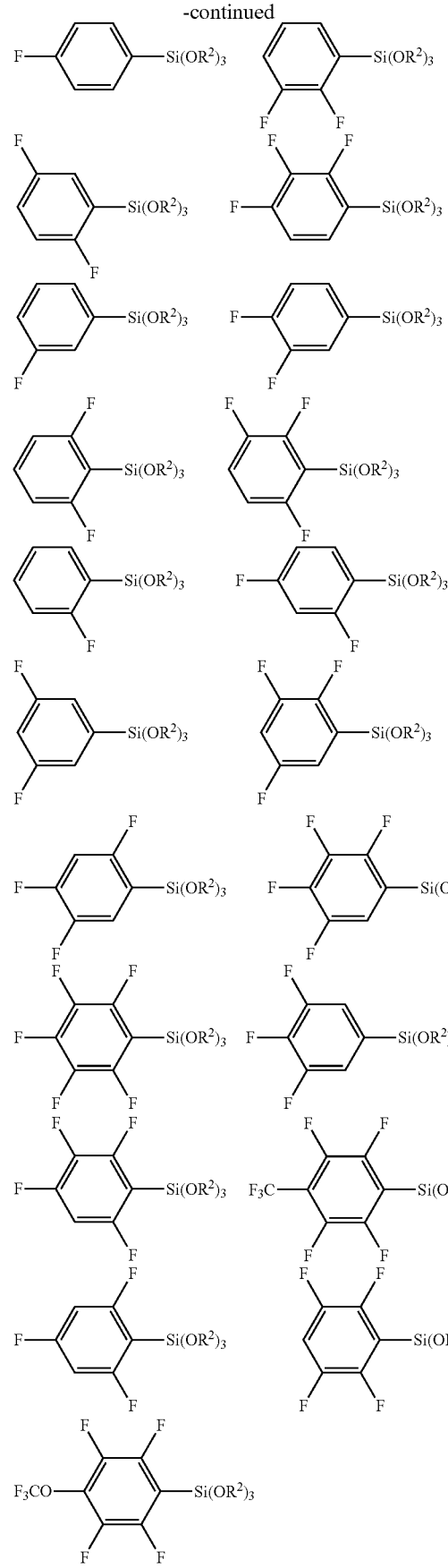

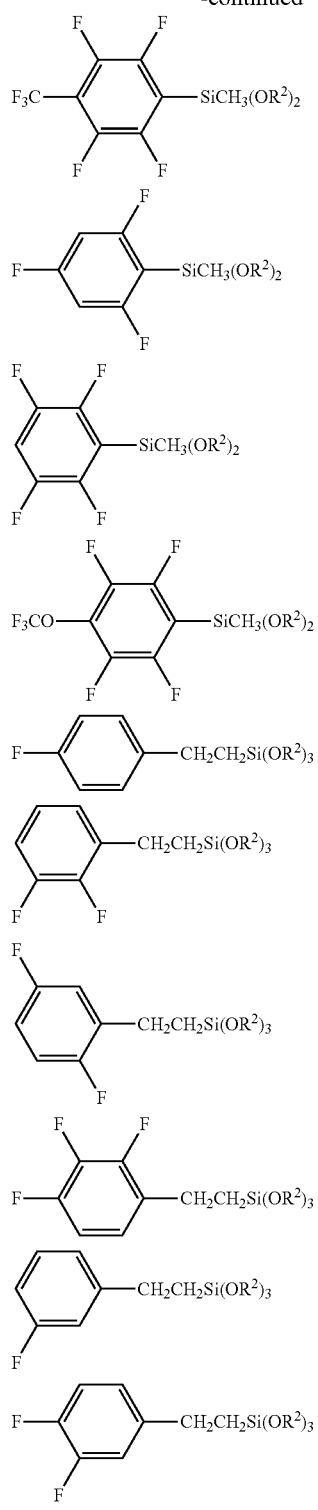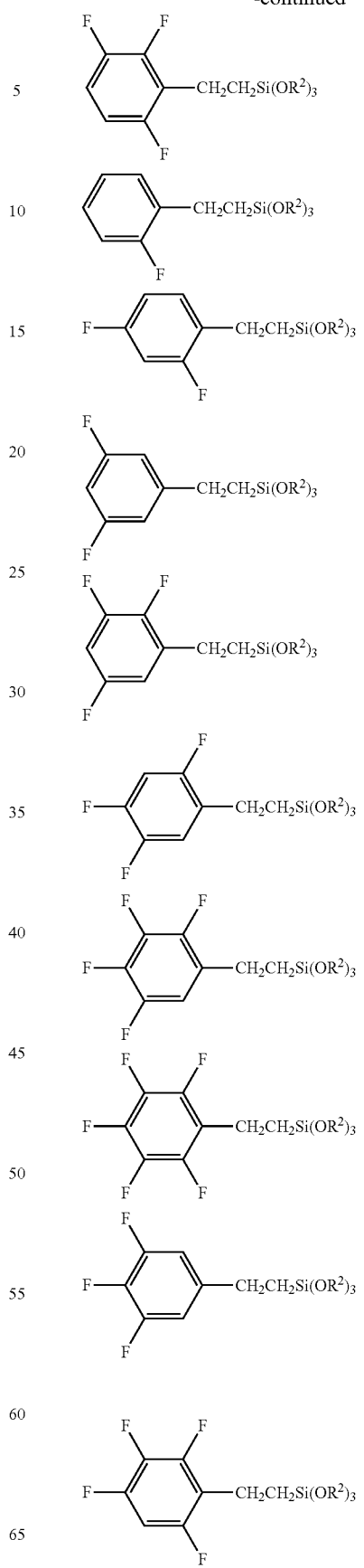

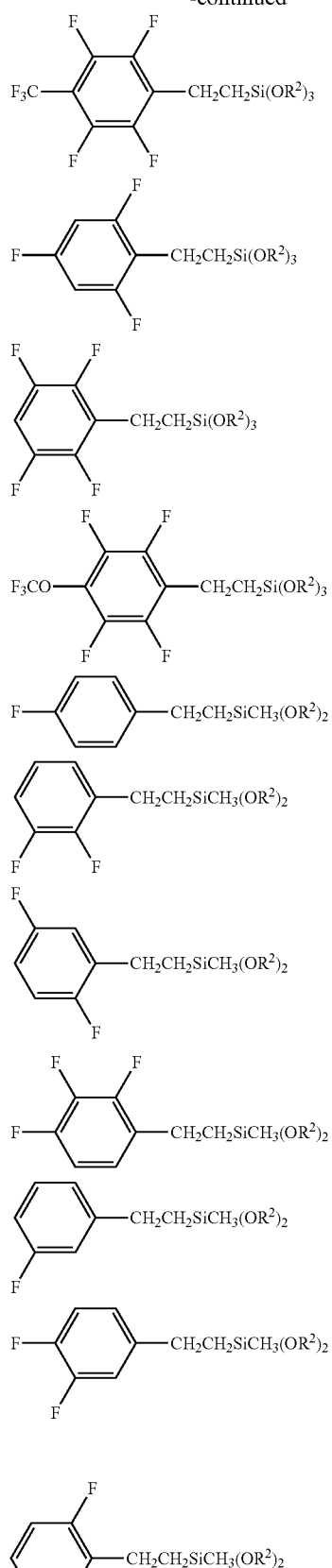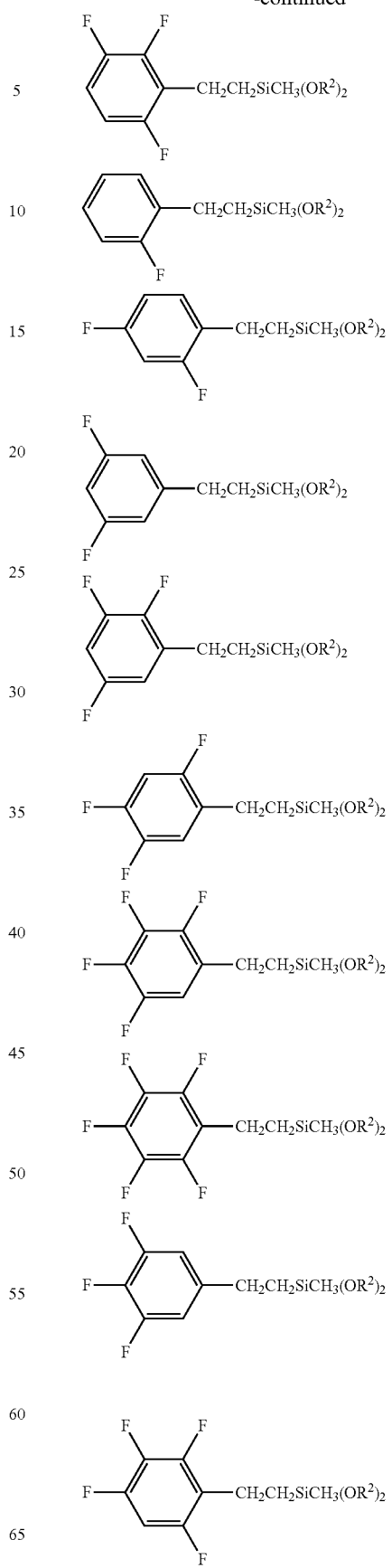

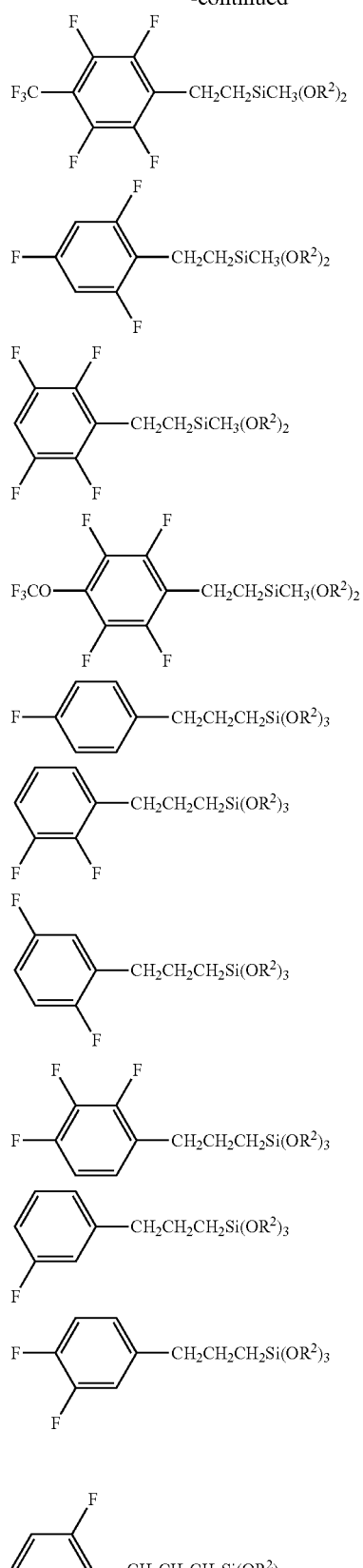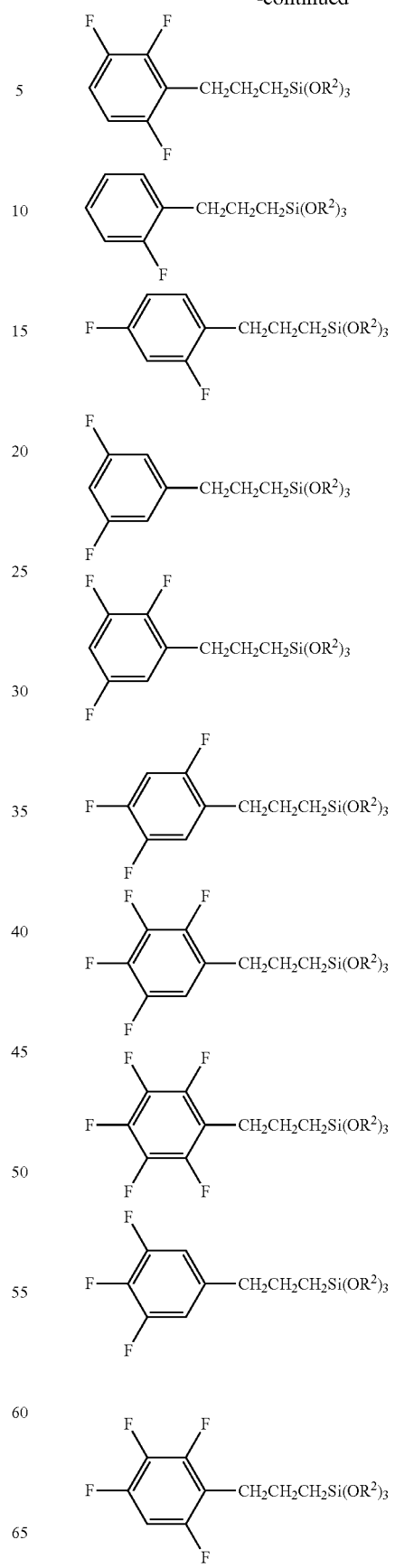

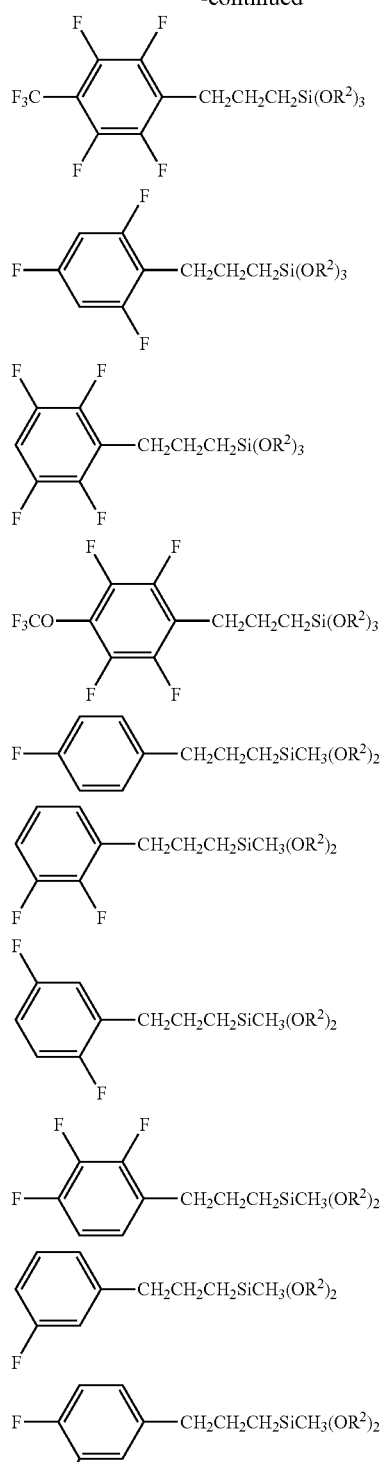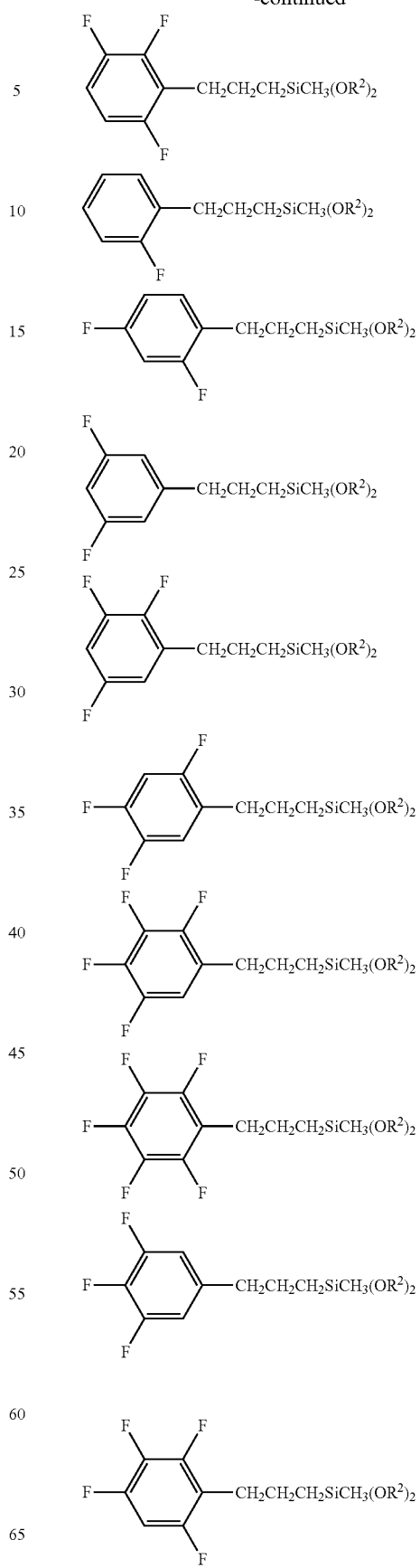

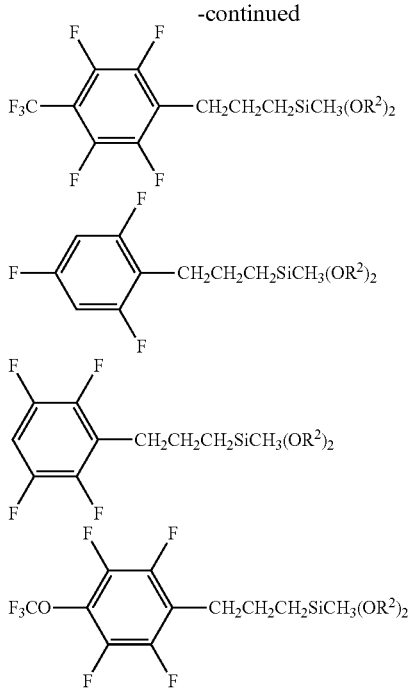

Examples of the compounds represented by the general formula (2-1) include the following, without limited thereto.

Examples of tetraalkoxysilanes include tetramethoxysilane, tetraethoxysilane, tetra-n-propoxysilane, and tetraisopropoxysilane.

Examples of trialkoxysilanes include trimethoxysilane, triethoxysilane, tri-n-propoxysilane, triisopropoxysilane, methyltrimethoxysilane, methyltriethoxysilane, methyltri-n-propoxysilane, methyltriisopropoxysilane, ethyltrimethoxysilane, ethyltriethoxysilane, ethyltri-n-propoxysilane, ethyltriisopropoxysilane, vinyltrimethoxysilane, vinyltriethoxysilane, vinyltri-n-propoxysilane, vinyltriisopropoxysilane, n-propyltrimethoxysilane, n-propyltriethoxysilane, n-propyltri-n-propoxysilane, n-propyltriisopropoxysilane, i-propyltrimethoxysilane, propyltriethoxysilane, i-propyltri-n-propoxysilane, i-propyltriisopropoxysilane, n-butyltrimethoxysilane, n-butyltriethoxysilane, n-butyltri-n-propoxysilane, n-butyltriisopropoxysilane, sec-butyltrimethoxysilane, sec-butyltriethoxysilane, sec-butyltri-n-propoxysilane, sec-butyltriisopropoxysilane, t-butyltrimethoxysilane, t-butyltriethoxysilane, t-butyltri-n-propoxysilane, t-butyltriisopropoxysilane, cyclopropyltrimethoxysilane, cyclopropyltriethoxysilane, cyclopropyltri-n-propoxysilane, cyclopropyltriisopropoxysilane, cyclobutyltrimethoxysilane, cyclobutyltriethoxysilane, cyclobutyltri-n-propoxysilane, cyclobutyltriisopropoxysilane, cyclopentyltrimethoxysilane, cyclopentyltriethoxysilane, cyclopentyltri-n-propoxysilane, cyclopentyltriisopropoxysilane, cyclohexyltrimethoxysilane, cyclohexyltriethoxysilane, cyclohexyltri-n-propoxysilane, cyclohexyltriisopropoxysilane, cyclohexenyltrimethoxysilane, cyclohexenyltriethoxysilane, cyclohexenyltri-n-propoxysilane, cyclohexenyltriisopropoxysilane, cyclohexenylethyltrimethoxysilane, cyclohexenylethyltriethoxysilane, cyclohexenylethyltri-n-propoxysilane, cyclohexenylethyltriisopropoxysilane, cyclooctanyltrimethoxysilane, cyclooctanyltriethoxysilane, cyclooctanyltri-n-propoxysilane, cyclooctanyltriisopropoxysilane, cyclopentadienylpropyltrimethoxysilane, cyclopentadienylpropyltriethoxysilane, cyclopentadienylpropyltri-n-propoxysilane, cyclopentadienylpropyltriisopropoxysilane, bicycloheptenyltrimethoxysilane, bicycloheptenyltriethoxysilane, bicycloheptenyltri-n-propoxysilane, bicycloheptenyltriisopropoxysilane, bicycloheptyltrimethoxysilane, bicycloheptyltriethoxysilane, bicycloheptyltri-n-propoxysilane, bicycloheptyltriisopropoxysilane, adamantyltrimethoxysilane, adamantyltriethoxysilane, adamantyltri-n-propoxysilane, adamantyltriisopropoxysilane, phenyltrimethoxysilane, phenyltriethoxysilane, phenyltri-n-propoxysilane, phenyltriisopropoxysilane, benzyltrimethoxysilane, benzyltriethoxysilane, benzyltri-n-propoxysilane, benzyltriisopropoxysilane, tolyltrimethoxysilane, tolyltriethoxysilane, tolyltri-n-propoxysilane, tolyltriisopropoxysilane, phenethyltrimethoxysilane, phenethyltriethoxysilane, phenethyltri-n-propoxysilane, phenethyltriisopropoxysilane, naphthyltrimethoxysilane, naphthyltriethoxysilane, naphthyltri-n-propoxysilane, and naphthyltriisopropoxysilane.

Examples of dialkoxysilanes include dimethyldimethoxysilane, dimethyldiethoxysilane, methylethyldimethoxysilane, methylethyldiethoxysilane, dimethyldi-n-propoxysilane, dimethyldiisopropoxysilane, diethyldimethoxysilane, diethyldiethoxysilane, diethyldi-n-propoxysilane, diethyldiisopropoxysilane, di-n-propyldimethoxysilane, di-n-propyldiethoxysilane, di-n-propyl-di-n-propoxysilane, di-n-propyldiisopropoxysilane, diisopropyldimethoxysilane, diisopropyldiethoxysilane, diisopropyldi-n-propoxysilane, diisopropyldiisopropoxysilane, di-n-butyldimethoxysilane, di-n-butyldiethoxysilane, di-n-butyldi-n-propoxysilane, di-n-butyldiisopropoxysilane, di-sec-butyldimethoxysilane, di-sec-butyldiethoxysilane, di-sec-butyldi-n-propoxysilane, di-sec-butyldiisopropoxysilane, di-t-butyldimethoxysilane, di-t-butyldiethoxysilane, di-t-butyldi-n-propoxysilane, di-t-butyldiisopropoxysilane, dicyclopropyldimethoxysilane, dicyclopropyldiethoxysilane, dicyclopropyldi-n-propoxysilane, dicyclopropyldiisopropoxysilane, dicyclobutyldimethoxysilane, dicyclobutyldiethoxysilane, dicyclobutyldi-n-propoxysilane, dicyclobutyldiisopropoxysilane, dicyclopentyldimethoxysilane, dicyclopentyldiethoxysilane, dicyclopentyldi-n-propoxysilane, dicyclopentyldiisopropoxysilane, dicyclohexyldimethoxysilane, dicyclohexyldiethoxysilane, dicyclohexyldi-n-propoxysilane, dicyclohexyldiisopropoxysilane, dicyclohexenyldimethoxysilane, dicyclohexenyldiethoxysilane, dicyclohexenyldi-n-propoxysilane, dicyclohexenyldiisopropoxysilane, dicyclohexenylethyldimethoxysilane, dicyclohexenylethyldiethoxysilane, dicyclohexenylethyldi-n-propoxysilane, dicyclohexenylethyldiisopropoxysilane, dicyclooctanyldimethoxysilane, dicyclooctanyldiethoxysilane, dicyclooctanyldi-n-propoxysilane, dicyclooctanyldiisopropoxysilane, dicyclopentadienylpropyldimethoxysilane, dicyclopentadienylpropyldiethoxysilane, dicyclopentadienylpropyldi-n-propoxysilane, dicyclopentadienylpropyldiisopropoxysilane, bisbicycloheptenyldimethoxysilane, bisbicycloheptenyldiethoxysilane, bisbicycloheptenyldi-n-propoxysilane, bisbicycloheptenyldiisopropoxysilane, bisbicycloheptyldimethoxysilane, bisbicycloheptyldiethoxysilane, bisbicycloheptyldi-n-propoxysilane, bisbicycloheptyldiisopropoxysilane, bisadamantyldimethoxysilane, bisadamantyldiethoxysilane, bisadamantyldi-n-propoxysilane, bisadamantyldiisopropoxysilane, diphenyldimethoxysilane, diphenyldiethoxysilane, methylphenyldimethoxysilane, methylphenyldiethoxysilane, diphenyldi-n-propoxysilane, and diphenyldiisopropoxysilane.

Examples of monoalkoxysilanes include trimethylmethoxysilane, trimethylethoxysilane, dimethylethylmethoxysilane, dimethylethylethoxysilane, dimethylphenylmethoxysilane, dimethylphenylethoxysilane, dimethylbenzylmethoxysilane, dimethylbenzylethoxysilane, dimethylphenethylmethoxysilane, and dimethylphenethylethoxysilane.

Preferable examples include tetramethoxysilane, tetraethoxysilane, methyltrimethoxysilane, methyltriethoxysilane, ethyltrimethoxysilane, ethyltriethoxysilane, vinyltrimethoxysilane, vinyltriethoxysilane, n-propyltrimethoxysilane, n-propyltriethoxysilane, isopropyltrimethoxysilane, isopropyltriethoxysilane, n-butyltrimethoxysilane, n-butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, phenethyltrimethoxysilane, phenethyltriethoxysilane, dimethyldimethoxysilane, dimethyldiethoxysilane, diethyldimethoxysilane, diethyldiethoxysilane, methylethyldimethoxysilane, methylethyldiethoxysilane, di-n-propyldimethoxysilane, di-n-butyldimethoxysilane, methylphenyldimethoxysilane, methylphenyldiethoxysilane, trimethylmethoxysilane, dimethylethylmethoxysilane, dimethylphenylmethoxysilane, dimethylbenzylmethoxysilane, and dimethylphenethylmethoxysilane.

Examples of the reactive compounds represented by the general formula (2-2) include the following, without limited thereto.

When U is boron, examples of the compounds represented by the general formula (2-2) include, as monomers, boron methoxide, boron ethoxide, boron propoxide, boron butoxide, boron amyloxide, boron hexyloxide, boron cyclopentoxide, boron cyclohexyloxide, boron allyloxide, boron phenoxide, boron methoxyethoxide, boric acid, and boron oxide.

When U is aluminum, examples of the compounds represented by the general formula (2-2) include, as monomers, aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxyethyl-acetoacetate, aluminum dibutoxyethyl-acetoacetate, aluminum propoxy-bis-ethyl-acetoacetate, aluminum butoxy-bis-ethyl-acetoacetate, aluminum 2,4-pentanedionate, and aluminum 2,2,6,6-tetramethyl-3,5-heptanedionate.

When U is gallium, examples of the compounds represented by the general formula (2-2) include, as monomers, gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxyethyl-acetoacetate, gallium dibutoxyethyl-acetoacetate, gallium propoxy-bis-ethyl-acetoacetate, gallium butoxy-bis-ethyl-acetoacetate, gallium 2,4-pentanedionate, and gallium 2,2,6,6-tetramethyl-3,5-heptanedionate.

When U is yttrium, examples of the compounds represented by the general formula (2-2) include, as monomers, yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxyethyl-acetoacetate, yttrium dibutoxyethyl-acetoacetate, yttrium propoxy-bis-ethyl-acetoacetate, yttrium butoxy-bis-ethyl-acetoacetate, yttrium 2,4-pentanedionate, and yttrium 2,2,6,6-tetramethyl-3,5-heptanedionate.

When U is germanium, examples of the compounds represented by the general formula (2-2) include, as monomers, germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, and germanium ethoxyethoxide.

When U is titanium, examples of the compounds represented by the general formula (2-2) include, as monomers, titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy-bisethyl-acetoacetate, titanium dibutoxy-bisethyl-acetoacetate, titanium dipropoxy-bis-2,4-pentanedionate, and titanium dibutoxy-bis-2,4-pentanedionate.

When U is zirconium, examples of the compounds represented by the general formula (2-2) include, as monomers, methoxy zirconium, ethoxy zirconium, propoxy zirconium, butoxy zirconium, phenoxy zirconium, zirconium dibutoxide-bis(2,4-pentanedionate), and zirconium dipropoxide-bis(2,2,6,6-tetramethyl-3,5-heptanedionate).

When U is hafnium, examples of the compounds represented by the general formula (2-2) include, as monomers, hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy-bisethyl-acetoacetate, hafnium dibutoxy-bisethyl-acetoacetate, hafnium dipropoxy-bis-2,4-pentanedionate, and hafnium dibutoxy-bis-2,4-pentanedionate.

When U is bismuth, examples of the compounds represented by the general formula (2-2) include, as monomers, methoxy bismuth, ethoxy bismuth, propoxy bismuth, butoxy bismuth, and phenoxy bismuth.

When U is tin, examples of the compounds represented by the general formula (2-2) include, as monomers, methoxy tin, ethoxy tin, propoxy tin, butoxy tin, phenoxy tin, methoxyethoxy tin, ethoxyethoxy tin, tin 2,4-pentanedionate, and tin 2,2,6,6-tetramethyl-3,5-heptanedionate.

When U is phosphorus, examples of the compounds represented by the general formula (2-2) include, as monomers, trimethyl phosphite, triethyl phosphite, tripropyl phosphite, trimethyl phosphate, triethyl phosphate, and tripropyl phosphate.

When U is vanadium, examples of the compounds represented by the general formula (2-2) include, as monomers, vanadium oxide-bis(2,4-pentanedionate), vanadium 2,4-pentanedionate, vanadium tributoxide oxide, and vanadium tripropoxide oxide.

When U is arsenic, examples of the compounds represented by the general formula (2-2) include, as monomers, methoxy arsenic, ethoxy arsenic, propoxy arsenic, butoxy arsenic, and phenoxy arsenic.

When U is antimony, examples of the compounds represented by the general formula (2-2) include, as monomers, methoxy antimony, ethoxy antimony, propoxy antimony, butoxy antimony, phenoxy antimony, antimony acetate, and antimony propionate.

When U is niobium, examples of the compounds represented by the general formula (2-2) include, as monomers, methoxy niobium, ethoxy niobium, propoxy niobium, butoxy niobium, and phenoxy niobium.

When U is tantalum, examples of the compounds represented by the general formula (2-2) include, as monomers, methoxy tantalum, ethoxy tantalum, propoxy tantalum, butoxy tantalum, and phenoxy tantalum.

It is possible to select one, or two or more kinds of a hydrolyzable silicon compound represented by the general formula (1) and one, or two or more compounds selected from the group consisting of a hydrolyzable silicon compound represented by the general formula (2-1) and a reactive compound represented by the general formula (2-2), and to mix them before or during the reaction, to prepare a reaction starting material for forming a silicon-containing compound (A).

As the preferable manufacturing methods, following methods may be mentioned, though not limited to them.

A silicon-containing compound (A) can be produced by hydrolysis-condensation of a hydrolyzable silicon compound represented by the general formula (1) and any one of a hydrolyzable silicon compound represented by the general formula (2-1) and a reactive compound represented by the general formula (2-2) or both (hereinafter, called "monomer") by using an acid, preferably one or more compounds selected from the group consisting of inorganic acids and sulfonic acid derivatives (aliphatic sulfonic acids and aromatic sulfonic acids), as a catalyst.

Examples of the acid catalysts to be used at this time include hydrofluoric acid, hydrochloric acid, hydrobromic acid, sulfuric acid, nitric acid, perchloric acid, phosphoric acid, methanesulfonic acid, benzenesulfonic acid, and toluenesulfonic acid. The catalyst is used in an amount of $10^{-6}$ to 10 moles, preferably $10^{-5}$ to 5 moles, more preferably $10^{-4}$ to 1 mole, relative to 1 mole of monomers.

The amount of water upon obtainment of the silicon-containing compound from these monomers by hydrolytic condensation, is 0.01 to 100 moles, preferably 0.05 to 50 moles, and more preferably 0.1 to 30 moles, per mole of hydrolyzable substitutional groups bonded to the monomers. Addition amounts 100 moles or less are economical, because the size of apparatuses to be used for reactions is not too large.

As a manipulation manner, the monomers are added into an aqueous catalyst solution, to cause initiation of a hydrolytic condensation reaction. At this time, an organic solvent may be added into the aqueous catalyst solution, or monomers may have been diluted with an organic solvent, or both procedures may be performed. The reaction temperature is to be 0 to 100° C., preferably 5 to 80° C.

It is a preferable manner to keep the temperature at 5 to 80° C. upon dropping of the monomers, and subsequently mature them at 20 to 80° C.

Examples of organic solvents, which can be added into the aqueous catalyst solution or which can dilute the monomers, include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl-2-n-amylketone, butane diol monomethyl ether, propylene glycol monomethyl ether, ethylene glycol monomethyl ether, butane diol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, and mixtures of them.

Water-soluble ones are preferable among them. Examples thereof include: alcohols such as methanol, ethanol, 1-propanol, and 2-propanol; polyvalent alcohols such as ethylene glycol and propylene glycol; polyvalent alcohol condensation derivatives such as butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether; acetone; acetonitrile; and tetrahydrofuran. Those having boiling points of 100° C. or lower are preferable among them.

Note that the usage amount of the organic solvent is preferably to be 0 to 1,000 ml, particularly preferably 0 to 500 ml, relative to 1 mole of monomers. Usage amounts of the organic solvent in this range need not use large reaction vessels, and thus, the reaction can be conducted economically.

Thereafter, neutralization reaction of the catalyst is conducted if necessary, and the alcohol produced by the hydrolytic condensation reaction is removed under reduced pressure, thereby obtaining an aqueous solution of reaction product mixture. At this time, the amount of an alkaline substance usable for neutralization is preferably 0.1 to 2 equivalents relative to the acid used as the catalyst. This alkaline substance is arbitrary, insofar as the same exhibits alkalinity in water.

Subsequently, it is preferable to remove by-products such as alcohols produced by the hydrolytic condensation reaction, from the reaction product mixture. Although the temperature for heating the reaction product mixture at this time depends on the kinds of the added organic solvent and alcohols and the like produced by the reaction, the temperature is preferably 0 to 100° C., more preferably 10 to 90° C., and even more preferably 15 to 80° C. Further, although the reduced pressure varies depending on the types of organic solvent and alcohol to be removed, types of evacuating apparatus and condensation apparatus, and the heating temperature, the reduced pressure is preferably at the atmospheric pressure or lower, more preferably 80 kPa or lower in absolute pressure, and even more preferably 50 kPa or lower in absolute pressure. Although it is difficult at this time to accurately determine amounts of alcohols to be removed, it is desirable to remove 80 mass % or more of produced alcohols and the like.

Next, it is possible to remove the acid catalyst used for the hydrolytic condensation, from the reaction product mixture. As a procedure for removing the acid catalyst, the silicon-containing compound is mixed with water, and the silicon-containing compound is extracted with an organic solvent. Suitable as an organic solvent to be used then, is one which allows for dissolution of the silicon-containing compound therein and which is separated in a two-layered manner from water upon mixing therewith. Examples thereof include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl-2-n-amylketone, butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, cyclopentyl methyl ether, and mixtures thereof.

It is also possible to use a mixture of a water-soluble organic solvent and a water hardly-soluble organic solvent. Examples of preferable mixtures include, without limited thereto, combinations of methanol+ethyl acetate, ethanol+ethyl acetate, 1-propanol+ethyl acetate, 2-propanol+ethyl acetate, butane diol monomethyl ether+ethyl acetate, propylene glycol monomethyl ether+ethyl acetate, ethylene glycol monomethyl ether+ethyl acetate, butane diol monoethyl ether+ethyl acetate, propylene glycol monoethyl ether+ethyl acetate, ethylene glycol monoethyl ether+ethyl acetate, butane diol monopropyl ether+ethyl acetate, propylene glycol monopropyl ether+ethyl acetate, ethylene glycol monopropyl ether+ethyl acetate, methanol+methyl isobutyl ketone, ethanol+methyl isobutyl ketone, 1-propanol+methyl isobutyl ketone, 2-propanol+methyl isobutyl ketone, propylene glycol monomethyl ether+methyl isobutyl ketone, ethylene glycol monomethyl ether+methyl isobutyl ketone, propylene glycol monoethyl ether+methyl isobutyl ketone, ethylene glycol monoethyl ether+methyl isobutyl ketone, propylene glycol monopropyl ether+methyl isobutyl ketone, ethylene glycol monopropyl ether+methyl isobutyl ketone, methanol+cyclopentyl methyl ether, ethanol+cyclopentyl methyl ether, 1-propanol+cyclopentyl methyl ether, 2-propanol+cyclopentyl methyl ether, propylene glycol monomethyl ether+cyclopentyl methyl ether, ethylene glycol monomethyl ether+cyclopentyl methyl ether, propylene glycol monoethyl ether+cyclopentyl methyl ether, ethylene glycol monoethyl ether+cyclopentyl methyl ether, propylene glycol monopropyl ether+cyclopentyl methyl ether, ethylene glycol monopropyl ether+cyclopentyl methyl ether, methanol+propylene glycol methyl ether acetate, ethanol+propylene glycol methyl ether acetate, 1-propanol+propylene glycol methyl ether acetate, 2-propanol+propylene glycol methyl ether acetate, propylene glycol monomethyl ether+propylene glycol methyl ether acetate, ethylene glycol monomethyl ether+propylene glycol methyl ether acetate, propylene glycol monoethyl ether+propylene glycol methyl ether acetate, ethylene glycol monoethyl ether+propylene glycol methyl ether acetate, propylene glycol monopropyl ether+propylene glycol methyl ether acetate, and ethylene glycol monopropyl ether+propylene glycol methyl ether acetate.

Note that although the mixing ratio of the water-soluble organic solvent and the water hardly-soluble organic solvent is to be appropriately selected, the water-soluble organic solvent is selected to be 0.1 to 1,000 parts by mass, preferably 1 to 500 parts by mass, more preferably 2 to 100 parts by mass, relative to 100 parts by mass of the water hardly-soluble organic solvent.

The procedure is followed by washing by neutral water. Usable as such water is so-called deionized water or ultrapure water. The amount of such water is to be 0.01 to 100 L, preferably 0.05 to 50 L, and more preferably 0.1 to 5 L, relative to 1 L of the silicon-containing compound solution. The washing procedure may be conducted by introducing both liquids into one vessel, stirring them, and then leaving them to stand still, followed by separation of a water layer. It is enough for the number of washing steps to be one or more, preferably one to about five, because commensurate effects are not obtained even by washing of ten or more times.

Other examples of methods for removing the acid catalyst include a method based on an ion-exchange resin, and a method for conducting neutralization by epoxy compounds such as ethylene oxide and propylene oxide followed by removal. These methods can be appropriately selected in conformity to the acid catalyst for the reaction.

The phrase that the acid catalyst has been substantially removed in the above catalyst removal operation, means that the acid catalyst used for the reaction is allowed to be left in an amount of about 10 mass % or less, preferably 5 mass % or less, relative to the amount added at the initiation of reaction in the silicon-containing compound.

Since a part of the silicon-containing compound is sometimes migrated into a water layer by the washing operation at this time to provide an effect substantially equivalent to a fractionation, the number of washing times and the amount of washing water may be appropriately selected in view of the catalyst removal effect and fractionation effect.

In both cases of a silicon-containing compound including the acid catalyst left therein and a silicon-containing compound solution from which the acid catalyst has been removed, a final solvent is added thereto, and solvent exchange is conducted under reduced pressure, to obtain a resultant silicon-containing compound solution. Although the temperature for solvent exchange depends on the types of reaction solvent, extraction solvent and the like to be removed, the temperature is preferably 0 to 100° C., more preferably 10 to 90° C., and even more preferably 15 to 80° C. Further, although the reduced pressure varies depending on the type of extraction solvent to be removed, types of evacuating apparatus and condensation apparatus, and the heating temperature, the reduced pressure is preferably at the atmospheric pressure or lower, more preferably 80 kPa or lower in absolute pressure, and even more preferably 50 kPa or lower in absolute pressure.

At this time, the silicon-containing compound is sometimes made unstable, due to exchange of solvents.

This phenomenon is caused depending on the compatibility between the final solvent and the silicon-containing compound, and it is possible to add the component (C) to be described later as a stabilizer, so as to prevent the phenomenon. The amount to be added is 0 to 25 parts by mass, preferably 0 to 15 parts by mass, and more preferably 0 to 5 parts by mass relative to 100 parts by mass of the silicon-containing compound in the solution before solvent exchange, and 0.5 or more parts by mass are preferable in case of addition. If necessary, it is possible to add the component (C) to the solution before solvent exchange and to subsequently conduct a solvent exchange operation.

When the silicon-containing compound is concentrated to a certain concentration or denser, condensation reaction is progressed, so that the compound might be changed into a state incapable of being re-dissolved in an organic solvent. As such, the compound is to be preferably kept in a solution state at an appropriate concentration. In turn, excessively diluted compounds might uneconomically lead to excessive amounts of solvents. Thus, the suitable concentration in this case is preferably 0.1 to 20 mass %.

Suitable as a final solvent to be added to the silicon-containing compound solution is an alcohol-based solvent, and particularly desirable examples thereof include monoalkyl ether derivatives of: ethylene glycol, diethylene glycol, triethylene glycol, propylene glycol, dipropylene glycol, and butanediol. Preferable examples concretely include butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether.

Alternatively, in the case that these solvents are main components, a non-alcoholic solvent may be added as a supplemental solvent. Examples of this supplemental solvents include acetone, tetrahydrofurane, toluene, hexane, ethyl acetate, cyclohexanone, methyl 2-n-amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, and cyclopentyl methyl ether.

As another operation for reaction, water or water-containing organic solvent is added to the monomers or an organic solution of monomers, to initiate a hydrolysis reaction. At this time, the catalyst may be added to the monomers or the organic solution of monomers, or may have been added into water or the water-containing organic solvent. The reaction temperature is to be 0 to 100° C., preferably 10 to 80° C. It is a preferable procedure to conduct heating to 10 to 50° C. upon dropping of water, and to subsequently raise the temperature to 20 to 80° C. for maturation.

In case of using organic solvents, water-soluble ones are preferable, and examples thereof include methanol, ethanol, 1-propanol, 2-propanol, 1-butanol, 2-butanol, 2-methyl-1-propanol, acetone, tetrahydrofuran, acetonitrile; and polyvalent alcohol condensate derivatives such as: butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; and mixtures thereof.

The usage amount of the organic solvent may be the same as the above. The obtained reaction product mixture is post-treated in the same manner as the above, to obtain a resultant silicon-containing compound.

Although the molecular weight of the obtained silicon-containing compound can be adjusted not only by selection of monomers but also by control of reaction condition upon polymerization, adoption of compounds having weight-average molecular weights exceeding 100,000 occasionally cause occurrence of extraneous substances or coating patch, so that those compounds are to be preferably used which have weight-average molecular weights of 100,000 or less, more preferably 200 to 50,000, and even more preferably 300 to 30,000, respectively.

Note that the data concerning the weight-average molecular weight is obtained as a molecular weight determined by gel permeation chromatography (GPC) using an RI detector and polystyrene standards.

The silicon-containing film-forming composition of the present invention is allowed to contain two or more kinds of silicon-containing compounds which are mutually different in composition and/or reaction condition, insofar as produced under acidic conditions, respectively.

In the present invention, the silicon-containing film-forming composition can be obtained by further blending the thermal crosslinking accelerator (B), the organic acid (C), and the organic solvent (D) into the silicon-containing compound (A).

In this way, the thermal crosslinking accelerator as the component (B) is contained in the composition of the present invention so as to further promote a cross-linking reaction upon formation of the silicon-containing film. Examples of such a thermal crosslinking accelerator include compounds represented by the general formula (3) or (4):

$$L_a H_b X \quad (3)$$

wherein L is lithium, sodium, potassium, rubidium, or cesium;

X is a hydroxyl group, or a monovalent, divalent or higher organic acid group having 1 to 30 carbon atoms;

a is an integer of 1 or more;

b is an integer of 0 or 1 or more; and a+b is a valence of the hydroxyl group or organic acid group, $$M_{a'} H_{b'} A \quad (4)$$

wherein M is a sulfonium group, an iodonium group, or an ammonium group, preferably a tertiary sulfonium, a secondary iodonium, or a quaternary ammonium;

A is a hydroxyl group, a monovalent, divalent, or higher organic acid group having 1 to 30 carbon atoms, or a non-nucleophilic counter ion;

a' is an integer of 1 or more;

b' is an integer of 0 or 1 or more; and a'+b' is a valence of the hydroxyl group, organic acid group, or non-nucleophilic counter ion.

Examples of the compounds represented by the general formula (3) include alkali metal salts of organic acids. Examples thereof include salts of lithium, sodium, potassium, rubidium, and cesium with monovalent acids such as hydroxide, formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, and trichloroacetic acid; and salts of lithium, sodium, potassium, rubidium and cesium with monovalent or divalent acids such as oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, and carbonic acid.

Concrete examples include lithium formate, lithium acetate, lithium propionate, lithium butanoate, lithium pentanoate, lithium hexanoate, lithium heptanoate, lithium octanoate, lithium nonanoate, lithium decanoate, lithium oleate, lithium stearate, lithium linoleate, lithium linolenate, lithium benzoate, lithium phthalate, lithium isophthalate, lithium terephthalate, lithium salicylate, lithium trifluoroacetate, lithium monochloroacetate, lithium dichloroacetate, lithium trichloroacetate, lithium hydroxide, lithium hydrogen oxalate, lithium hydrogen malonate, lithium hydrogen methylmalonate, lithium hydrogen ethylmalonate, lithium hydrogen propylmalonate, lithium hydrogen butylmalonate, lithium hydrogen dimethylmalonate, lithium hydrogen diethylmalonate, lithium hydrogen succinate, lithium hydrogen methylsuccinate, lithium hydrogen glutarate, lithium hydrogen adipate, lithium hydrogen itaconate, lithium hydrogen maleate, lithium hydrogen fumarate, lithium hydrogen citraconate, lithium hydrogen citrate, lithium hydrogen carbonate, lithium oxalate, lithium malonate, lithium methylmalonate, lithium ethylmalonate, lithium propylmalonate, lithium butylmalonate, lithium dimethylmalonate, lithium diethylmalonate, lithium succinate, lithium methylsuccinate, lithium glutarate, lithium adipate, lithium itaconate, lithium maleate, lithium fumarate, lithium citraconate, lithium citrate, and lithium carbonate;

sodium formate, sodium acetate, sodium propionate, sodium butanoate, sodium pentanoate, sodium hexanoate, sodium heptanoate, sodium octanoate, sodium nonanoate, sodium decanoate, sodium oleate, sodium stearate, sodium linoleate, sodium linolenate, sodium benzoate, sodium phthalate, sodium isophthalate, sodium terephthalate, sodium salicylate, sodium trifluoroacetate, sodium monochloroacetate, sodium dichloroacetate, sodium trichloroacetate, sodium hydroxide, sodium hydrogen oxalate, sodium hydrogen malonate, sodium hydrogen methylmalonate, sodium hydrogen ethylmalonate, sodium hydrogen propylmalonate, sodium hydrogen butylmalonate, sodium hydrogen dimethylmalonate, sodium hydrogen diethylmalonate, sodium hydrogen succinate, sodium hydrogen methylsuccinate, sodium hydrogen glutarate, sodium hydrogen adipate, sodium hydrogen itaconate, sodium hydrogen maleate, sodium hydrogen fumarate, sodium hydrogen citraconate, sodium hydrogen citrate, sodium hydrogen carbonate, sodium oxalate, sodium malonate, sodium methylmalonate, sodium ethylmalonate, sodium propylmalonate, sodium butylmalonate, sodium dimethylmalonate, sodium diethylmalonate, sodium succinate, sodium methylsuccinate, sodium glutarate, sodium adipate, sodium itaconate, sodium maleate, sodium fumarate, sodium citraconate, sodium citrate, and sodium carbonate; and potassium formate, potassium acetate, potassium propionate, potassium butanoate, potassium pentanoate, potassium hexanoate, potassium heptanoate, potassium octanoate, potassium nonanoate, potassium decanoate, potassium oleate, potassium stearate, potassium linoleate, potassium linolenate, potassium benzoate, potassium phthalate, potassium isophthalate, potassium terephthalate, potassium salicylate, potassium trifluoroacetate, potassium monochloroacetate, potassium dichloroacetate, potassium trichloroacetate, potassium hydroxide, potassium hydrogen oxalate, potassium hydrogen malonate, potassium hydrogen methylmalonate, potassium hydrogen ethylmalonate, potassium hydrogen propylmalonate, potassium hydrogen butylmalonate, potassium hydrogen dimethylmalonate, potassium hydrogen diethylmalonate, potassium hydrogen succinate, potassium hydrogen methylsuccinate, potassium hydrogen glutarate, potassium hydrogen adipate, potassium hydrogen itaconate, potassium hydrogen maleate, potassium hydrogen fumarate, potassium hydrogen citraconate, potassium hydrogen citrate, potassium hydrogen carbonate, potassium oxalate, potassium malonate, potassium methylmalonate, potassium ethylmalonate, potassium propylmalonate, potassium butylmalonate, potassium dimethylmalonate, potassium diethylmalonate, potassium succinate, potassium methylsuccinate, potassium glutarate, potassium adipate, potassium itaconate, potassium maleate, potassium fumarate, potassium citraconate, potassium citrate, and potassium carbonate.

Examples of the compounds represented by the general formula (4) include sulfonium compounds, iodonium compounds, and ammonium compounds represented by the following general formulae (Q-1), (Q-2), and (Q-3), respectively:

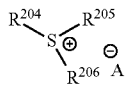
(Q-1)

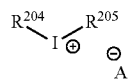
(Q-2)

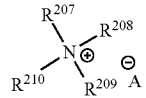
(Q-3)

wherein $R^{204}$, $R^{205}$, and $R^{206}$ each represent a linear, branched, or cyclic alkyl, alkenyl, oxoalkyl, or oxoalkenyl group having 1 to 12 carbon atoms, a substituted or unsubstituted aryl group having 6 to 20 carbon atoms, or an aralkyl or aryloxoalkyl group having 7 to 12 carbon atoms, wherein some or all hydrogen atoms of these groups may be substituted by alkoxyl groups or the like, and wherein $R^{205}$ and $R^{206}$ may form a ring together with a sulfur atom to which they bond, and when a ring is formed, $R^{205}$ and $R^{206}$ each represent an alkylene group having 1 to 6 carbon atoms;

$A^-$ represents a non-nucleophilic counter ion; and $R^{207}$, $R^{208}$, $R^{209}$, and $R^{210}$ are the same as $R^{204}$, $R^{205}$, and $R^{206}$, and may be a hydrogen atom;

wherein $R^{207}$ and $R^{208}$, or $R^{207}$, $R^{208}$ and $R^{209}$ may form a ring together with a nitrogen atom to which they bond, and when a ring is formed, $R^{207}$ and $R^{208}$, or $R^{207}$, $R^{208}$ and $R^{209}$ represent an alkylene group having 3 to 10 carbon atoms.

$R^{204}$, $R^{205}$, $R^{206}$, $R^{207}$, $R^{208}$, $R^{209}$, and $R^{210}$ may be the same or different from one another, and concrete examples of alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl groups. Examples of alkenyl groups include vinyl, allyl, propenyl, butenyl, hexenyl, and cyclohexenyl groups. Examples of oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl groups. Examples of aryl groups include phenyl and naphthyl groups; alkoxyphenyl groups such as p-methoxyphenyl, m-methoxyphenyl, o-methoxyphenyl, ethoxyphenyl, p-tert-butoxyphenyl, and m-tert-butoxyphenyl groups; alkylphenyl groups such as 2-methylphenyl, 3-methylphenyl, 4-methylphenyl, ethylphenyl, 4-tert-butylphenyl, 4-butylphenyl, and dimethylphenyl groups; alkylnaphthyl groups such as methylnaphthyl and ethylnaphthyl groups; alkoxynaphthyl groups such as methoxynaphthyl and ethoxynaphthyl groups; dialkylnaphthyl groups such as dimethylnaphthyl and diethylnaphthyl groups; and dialkoxynaphthyl groups such as dimethoxynaphthyl and diethoxynaphthyl groups. Examples of aralkyl groups include benzyl, phenylethyl, and phenethyl groups. Examples of aryloxoalkyl groups include 2-aryl-2-oxoethyl groups such as 2-phenyl-2-oxoethyl, 2-(1-naphthyl)-2-oxoethyl, and 2-(2-naphthyl)-2-oxoethyl groups.

Examples of $A^-$ include hydroxyl ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, p-methylbenzoate ion, p-t-butylbenzoate ion, phthalate ion, isophthalate ion, terephthalate ion, salicylate ion, trifluoroacetate ion, monochloroacetate ion, dichloroacetate ion, trichloroacetate ion, nitrate ion, chlorate ion, perchlorate ion, bromate ion, iodate ion, oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, and carbonate ion.

Concrete examples of sulfonium compounds include triphenylsulfonium formate, triphenylsulfonium acetate, triphenylsulfonium propionate, triphenylsulfonium butanoate, triphenylsulfonium pentanoate, triphenylsulfonium hexanoate, triphenylsulfonium heptanoate, triphenylsulfonium octanoate, triphenylsulfonium nonanoate, triphenylsulfonium decanoate, triphenylsulfonium oleate, triphenylsulfonium stearate, triphenylsulfonium linoleate, triphenylsulfonium linolenate, triphenylsulfonium benzoate, triphenylsulfonium p-methylbenzoate, triphenylsulfonium p-t-butylbenzoate, triphenylsulfonium phthalate, triphenylsulfonium isophthalate, triphenylsulfonium terephthalate, triphenylsulfonium salicylate, triphenylsulfonium trifluoroacetate, triphenylsulfonium monochloroacetate, triphenylsulfonium dichloroacetate, triphenylsulfonium trichloroacetate, triphenylsulfonium hydroxide, triphenylsulfonium oxalate, triphenylsulfonium malonate, triphenylsulfonium methylmalonate, triphenylsulfonium ethylmalonate, triphenylsulfonium propylmalonate, triphenylsulfonium butylmalonate, triphenylsulfonium dimethylmalonate, triphenylsulfonium diethylmalonate, triphenylsulfonium succinate, triphenylsulfonium methylsuccinate, triphenylsulfonium glutarate, triphenylsulfonium adipate, triphenylsulfonium itaconate, triphenylsulfonium maleate, triphenylsulfonium fumarate, triphenylsulfonium citraconate, triphenylsulfonium citrate, triphenylsulfonium carbonate, triphenylsulfonium chloride, triphenylsulfonium bromide, triphenylsulfonium iodide, triphenylsulfonium nitrate, triphenylsulfonium chlorate, triphenylsulfonium perchlorate, triphenylsulfonium bromate, triphenylsulfonium iodide, bistriphenylsulfonium oxalate, bistriphenylsulfonium malonate, bistriphenylsulfonium methylmalonate, bistriphenylsulfonium ethylmalonate, bistriphenylsulfonium propylmalonate, bistriphenylsulfonium butylmalonate, bistriphenylsulfonium dimethylmalonate, bistriphenylsulfonium diethylmalonate, bistriphenylsulfonium succinate, bistriphenylsulfonium methylsuccinate, bistriphenylsulfonium glutarate, bistriphenylsulfonium adipate, bistriphenylsulfonium itaconate, bistriphenylsulfonium maleate, bistriphenylsulfonium fumarate, bistriphenylsulfonium citraconate, bistriphenylsulfonium citrate, and bistriphenylsulfonium carbonate.

Concrete examples of iodonium compounds include diphenyliodonium formate, diphenyliodonium acetate, diphenyliodonium propionate, diphenyliodonium butanoate, diphenyliodonium pentanoate, diphenyliodonium hexanoate, diphenyliodonium heptanoate, diphenyliodonium octanoate, diphenyliodonium nonanoate, diphenyliodonium decanoate, diphenyliodonium oleate, diphenyliodonium stearate, diphenyliodonium linoleate, diphenyliodonium linolenate, diphenyliodonium benzoate, diphenyliodonium p-methylbenzoate, diphenyliodonium p-t-butylbenzoate, diphenyliodonium phthalate, diphenyliodonium isophthalate, diphenyliodonium terephthalate, diphenyliodonium salicylate, diphenyliodonium trifluoroacetate, diphenyliodonium monochloroacetate, diphenyliodonium dichloroacetate, diphenyliodonium trichloroacetate, diphenyliodonium hydroxide, diphenyliodonium oxalate, diphenyliodonium malonate, diphenyliodonium methylmalonate, diphenyliodonium ethylmalonate, diphenyliodonium propylmalonate, diphenyliodonium butylmalonate, diphenyliodonium dimethylmalonate, diphenyliodonium diethylmalonate, diphenyliodonium succinate, diphenyliodonium methylsuccinate, diphenyliodonium glutarate, diphenyliodonium adipate, diphenyliodonium itaconate, diphenyliodonium maleate, diphenyliodonium fumarate, diphenyliodonium citraconate, diphenyliodonium citrate, diphenyliodonium carbonate, diphenyliodonium chloride, diphenyliodonium bromide, diphenyliodonium iodide, diphenyliodonium nitrate, diphenyliodonium chlorate, diphenyliodonium perchlorate, diphenyliodonium bromate, diphenyliodonium iodide, bisdiphenyliodonium oxalate, bisdiphenyliodonium malonate, bisdiphenyliodonium methylmalonate, bisdiphenyliodonium ethylmalonate, bisdiphenyliodonium propylmalonate, bisdiphenyliodonium butylmalonate, bisdiphenyliodonium dimethylmalonate, bisdiphenyliodonium diethylmalonate, bisdiphenyliodonium succinate, bisdiphenyliodonium methylsuccinate, bisdiphenyliodonium glutarate, bisdiphenyliodonium adipate, bisdiphenyliodonium itaconate, bisdiphenyliodonium maleate, bisdiphenyliodonium fumarate, bisdiphenyliodonium citraconate, bisdiphenyliodonium citrate, and bisdiphenyliodonium carbonate.

Concrete examples of ammonium compounds include tetramethylammonium formate, tetramethylammonium acetate, tetramethylammonium propionate, tetramethylammonium butanoate, tetramethylammonium pentanoate, tetramethylammonium hexanoate, tetramethylammonium heptanoate, tetramethylammonium octanoate, tetramethylammonium nonanoate, tetramethylammonium decanoate, tetramethylammonium oleate, tetramethylammonium stearate, tetramethylammonium linoleate, tetramethylammonium linolenate, tetramethylammonium benzoate, tetramethylammonium p-methylbenzoate, tetramethylammonium p-t-butylbenzoate, tetramethylammonium phthalate, tetramethylammonium isophthalate, tetramethylammonium terephthalate, tetramethylammonium salicylate, tetramethylammonium trifluoroacetate, tetramethylammonium monochloroacetate, tetramethylammonium dichloroacetate, tetramethylammonium trichloroacetate, tetramethylammonium hydroxide, tetramethylammonium oxalate, tetramethylammonium malonate, tetramethylammonium methylmalonate, tetramethylammonium ethylmalonate, tetramethylammonium propylmalonate, tetramethylammonium butylmalonate, tetramethylammonium dimethylmalonate, tetramethylammonium diethylmalonate, tetramethylammonium succinate, tetramethylammonium methylsuccinate, tetramethylammonium glutarate, tetramethylammonium adipate, tetramethylammonium itaconate, tetramethylammonium maleate, tetramethylammonium fumarate, tetramethylammonium citraconate, tetramethylammonium citrate, tetramethylammonium carbonate, tetramethylammonium chloride, tetramethylammonium bromide, tetramethylammonium iodide, tetramethylammonium nitrate, tetramethylammonium chlorate, tetramethylammonium perchlorate, tetramethylammonium bromate, tetramethylammonium iodide, bistetramethylammonium oxalate, bistetramethylammonium malonate, bistetramethylammonium methylmalonate, bistetramethylammonium ethylmalonate, bistetramethylammonium propylmalonate, bistetramethylammonium butylmalonate, bistetramethylammonium dimethylmalonate, bistetramethylammonium diethylmalonate, bistetramethylammonium succinate, bistetramethylammonium methylsuccinate, bistetramethylammonium glutarate, bistetramethylammonium adipate, bistetramethylammonium itaconate, bistetramethylammonium maleate, bistetramethylammonium fumarate, bistetramethylammonium citraconate, bistetramethylammonium citrate, bistetramethylammonium carbonate; tetrapropylammonium formate, tetrapropylammonium acetate, tetrapropylammonium propionate, tetrapropylammonium butanoate, tetrapropylammonium pentanoate, tetrapropylammonium hexanoate, tetrapropylammonium heptanoate, tetrapropylammonium octanoate, tetrapropylammonium nonanoate, tetrapropylammonium decanoate, tetrapropylammonium oleate, tetrapropylammonium stearate, tetrapropylammonium linoleate, tetrapropylammonium linolenate, tetrapropylammonium benzoate, tetrapropylammonium p-methylbenzoate, tetrapropylammonium p-t-butylbenzoate, tetrapropylammonium phthalate, tetrapropylammonium isophthalate, tetrapropylammonium terephthalate, tetrapropylammonium salicylate, tetrapropylammonium trifluoroacetate, tetrapropylammonium monochloroacetate, tetrapropylammonium dichloroacetate, tetrapropylammonium trichloroacetate, tetrapropylammonium hydroxide, tetrapropylammonium oxalate, tetrapropylammonium malonate, tetrapropylammonium methylmalonate, tetrapropylammonium ethylmalonate, tetrapropylammonium propylmalonate, tetrapropylammonium butylmalonate, tetrapropylammonium dimethylmalonate, tetrapropylammonium diethylmalonate, tetrapropylammonium succinate, tetrapropylammonium methylsuccinate, tetrapropylammonium glutarate, tetrapropylammonium adipate, tetrapropylammonium itaconate, tetrapropylammonium maleate, tetrapropylammonium fumarate, tetrapropylammonium citraconate, tetrapropylammonium citrate, tetrapropylammonium carbonate, tetrapropylammonium chloride, tetrapropylammonium bromide, tetrapropylammonium iodide, tetrapropylammonium nitrate, tetrapropylammonium chlorate, tetrapropylammonium perchlorate, tetrapropylammonium bromate, tetrapropylammonium iodate, bistetrapropylammonium oxalate, bistetrapropylammonium malonate, bistetrapropylammonium methylmalonate, bistetrapropylammonium ethylmalonate, bistetrapropylammonium propylmalonate, bistetrapropylammonium butylmalonate, bistetrapropylammonium dimethylmalonate, bistetrapropylammonium diethylmalonate, bistetrapropylammonium succinate, bistetrapropylammonium methylsuccinate, bistetrapropylammonium glutarate, bistetrapropylammonium adipate, bistetrapropylammonium itaconate, bistetrapropylammonium maleate, bistetrapropylammonium fumarate, bistetrapropylammonium citraconate, bistetrapropylammonium citrate, bistetrapropylammonium carbonate; and tetrabutylammonium formate, tetrabutylammonium acetate, tetrabutylammonium propionate, tetrabutylammonium butanoate, tetrabutylammonium pentanoate, tetrabutylammonium hexanoate, tetrabutylammonium heptanoate, tetrabutylammonium octanoate, tetrabutylammonium nonanoate, tetrabutylammonium decanoate, tetrabutylammonium oleate, tetrabutylammonium stearate, tetrabutylammonium linoleate, tetrabutylammonium linolenate, tetrabutylammonium benzoate, tetrabutylammonium p-methylbenzoate, tetrabutylammonium p-t-butylbenzoate, tetrabutylammonium phthalate, tetrabutylammonium isophthalate, tetrabutylammonium terephthalate, tetrabutylammonium salicylate, tetrabutylammonium trifluoroacetate, tetrabutylammonium monochloroacetate, tetrabutylammonium dichloroacetate, tetrabutylammonium trichloroacetate, tetrabutylammonium hydroxide, tetrabutylammonium oxalate, tetrabutylammonium malonate, tetrabutylammonium methylmalonate, tetrabutylammonium ethylmalonate, tetrabutylammonium propylmalonate, tetrabutylammonium butylmalonate, tetrabutylammonium dimethylmalonate, tetrabutylammonium diethylmalonate, tetrabutylammonium succinate, tetrabutylammonium methylsuccinate, tetrabutylammonium glutarate, tetrabutylammonium adipate, tetrabutylammonium itaconate, tetrabutylammonium maleate, tetrabutylammonium fumarate, tetrabutylammonium citraconate, tetrabutylammonium citrate, tetrabutylammonium carbonate, tetrabutylammonium chloride, tetrabutylammonium bromide, tetrabutylammonium iodide, tetrabutylammonium nitrate, tetrabutylammonium chlorate, tetrabutylammonium perchlorate, tetrabutylammonium bromate, tetrabutylammonium iodate, bistetrabutylammonium oxalate, bistetrabutylammonium malonate, bistetrabutylammonium methylmalonate, bistetrabutylammonium ethylmalonate, bistetrabutylammonium propylmalonate, bistetrabutylammonium butylmalonate, bistetrabutylammonium dimethylmalonate, bistetrabutylammonium diethylmalonate, bistetrabutylammonium succinate, bistetrabutylammonium methylsuccinate, bistetrabutylammonium glutarate, bistetrabutylammonium adipate, bistetrabutylammonium itaconate, bistetrabutylammonium maleate, bistetrabutylammonium fumarate, bistetrabutylammonium citraconate, bistetrabutylammonium citrate, and bistetrabutylammonium carbonate.

Note that the thermal crosslinking accelerators (B) can be used solely in one kind or combinedly in two or more kinds. The addition amount of the thermal crosslinking accelerators is preferably 0.01 to 50 parts by mass, and more preferably 0.1 to 40 parts by mass, relative to 100 parts by mass of the base polymer (i.e., the silicon-containing compound of the component (A) obtained by the above procedure).

To ensure stability of the thermosetting silicon-containing film-forming composition of the present invention, it is necessary to add a monovalent, divalent, or higher organic acid having 1 to 30 carbon atoms as the component (C). Examples of the organic acids to be added include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, and citric acid. Particularly preferable examples include oxalic acid, maleic acid, formic acid, acetic acid, propionic acid, and citric acid. It is possible to mixingly use two or more kinds of acids, so as to keep the stability.

The addition amount is 0.001 to 25 parts by mass, preferably 0.01 to 15 parts by mass, and more preferably 0.1 to 5 parts by mass, relative to 100 parts by mass of the silicon-containing compound in the composition.

Alternatively, the organic acid is preferably blended in a manner to achieve $0 \leq pH \leq 7$, more preferably $0.3 \leq pH \leq 6.5$, and even more preferably $0.5 \leq p \leq 6$, when evaluated as a pH of the composition.

To be used as the component (D) for the composition of the present invention containing the silicon-containing compound, is the same organic solvent as used upon production of the silicon-containing compound (A) as described above, and preferable examples to be used include water-soluble organic solvents, particularly monoalkyl ether derivatives of ethylene glycol, diethylene glycol, triethylene glycol, propylene glycol, dipropylene glycol, butanediol, and pentanediol. Concretely used are organic solvents selected from among butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, ethylene glycol monopropyl ether, and the like.

Into the thermosetting silicon-containing film-forming composition of the present invention may be added water. If water is added, a silicon-containing compound is hydrated thereby increasing a lithography performance. Preferable content rate of water in the solvent component of the composition, when water is added, is more than 0% by mass and less than 50% by mass, in particular, preferably 0.3 to 30% by mass, or more preferably 0.5 to 20% by mass.

With this amount of addition, uniformity and lithography performance of a coated film may be improved.

The usage amount of all the solvents including water is preferably 500 to 100,000 parts by mass, and particularly 400 to 50,000 parts by mass, relative to 100 parts by mass of the base polymer of the component (A).

In the present invention, it is possible to use a photoacid generator. Concrete examples of photoacid generators to be used in the present invention include a material described in paragraphs (0160) to (0179) of Japanese Patent Laid-Open (kokai) No. 2009-126940.

Further, the silicon-containing film-forming composition can be improved in stability, by adding thereto, as a stabilizer, a monovalent or divalent or higher alcohol having a cyclic ether as a substitutional group, particularly a material described in paragraphs (0181) to (0184) of Japanese Patent Laid-Open (kokai) No. 2009-126940.

In the present invention, it is possible to blend a surfactant, as required. Concrete examples of such a surfactant include a material described in paragraph (0185) of Japanese Patent Laid-Open (kokai) No. 2009-126940.

The silicon-containing film formed from the composition of the present invention useful as an etching mask can be formed on a substrate by spin coating or the like, similarly to a photoresist film. After spin coating, the composition is desirably baked, so as to evaporate the solvent therein, and to promote crosslinking reaction for preventing the film from being mixed with the overlying resist film. Baking is to be preferably conducted within a temperature range of 50 to 500° C. and within a time range of 10 to 300 seconds. Particularly preferably, the temperature range is 400° C. or lower for decreased thermal damage against a device to be produced, depending on the structure thereof.

Here, it is possible in the present invention to form the silicon-containing film by using the composition of the present invention on a processing portion of a processing substrate by interposing an organic film as a resist lower layer film therebetween, and to form a photoresist film on the silicon-containing film, thereby conducting pattern formation.

In this case, examples of processing portions of a processing substrate include a low-dielectric constant insulating film having a k value of 3 or less, a primarily processed low-dielectric constant insulating film, a nitrogen and/or oxygen-containing inorganic film, and a metal film. Note that the lower layer film is preferably an organic film, and the resist composition for forming a photoresist film is preferably a chemically amplified resist composition without including silicon.

More specifically, the processing substrate may be a base substrate formed thereon with a processing layer (processing portion). The base substrate is not particularly limited, and may be made of a material such as Si, amorphous silicon (α-Si), p-Si, SiO$_2$, SiN, SiON, W, TiN, Al, and the like, which is different from that of a processing layer. Usable as processing layers are Si, SiO$_2$, SiN, SiON, p-Si, α-Si, W, W—Si, Al, Cu, Al—Si, etc., various low dielectric films, and etching stopper therefor, and each processing layer can be typically formed to have a thickness of 50 to 10,000 nm, particularly 100 to 5,000 nm.

When the silicon-containing film formed from the composition of the invention is used in an exposure process based on ArF excimer laser light, the overlying resist film may be any of typical resist compositions for ArF excimer laser light. Numerous candidates are known for a resist composition for ArF excimer laser light, such that each of them includes as main components: in case of a positive resist composition, a resin which is made soluble in an alkaline aqueous solution as a result of decomposition of acid labile groups by an action of an acid, a photoacid generator, and a basic substance for controlling acid diffusion; and in case of a negative resist composition, a resin which is made insoluble in an alkaline aqueous solution as a result of reaction with a crosslinker under the action of an acid, a photoacid generator, a crosslinker, and a basic substance for controlling acid diffusion; such that the characteristics of the resist compositions differ depending on what types of resins are used. Already known resins are generally classified into poly(meth)acrylic, COMA (cycloolefin maleic anhydride), COMA-(meth) acrylic hybrid, ROMP (ring-opening metathesis polymerization), and polynorbornene systems. Among them, the resist composition adopting a poly(meth)acrylic resin has an alicycle skeleton introduced into a side-chain to ensure an etching resistance, to exhibit a resolution performance superior to other resin systems.

While many are known as resist compositions adopting poly(meth)acrylic resins for ArF excimer laser (Japanese Patent Laid-Open (kokai) No. 2003-84438, for example), the polymer in any of positive compositions is constituted of: a combination of units for ensuring an etching resistance as a main function, units which are decomposed by an action of an acid and turned to be alkali soluble, and units for ensuring adhesion; or a combination including one unit capable of providing two or more of the above functions, as the case may be. Particularly preferably used among them as the unit to be changed in alkali solubility by an acid, are (meth)acrylic acid esters having an acid labile group with an adamantane skeleton, and (meth)acrylic acid esters having an acid labile group with a norbornane or tetracyclododecane skeleton, by virtue of higher resolution and etching resistance provided by them. Further, particularly preferably used as the units for ensuring adhesion, are (meth)acrylic acid esters having a norbornane side chain with a lactone ring, (meth)acrylic acid esters having an oxanorbornane side chain, and (meth)acrylic acid esters having a hydroxyadamantyl side chain, by virtue of satisfactory etching resistance and higher resolution provided by them. Moreover, attention has been directed to a polymer comprising units having as a functional group an alcohol which exhibits acidity by fluorine substitution on the vicinal site as a resist polymer corresponding to an immersion method which has been particularly recently noticed since the units impart anti-swelling physical properties and thus high resolution to the polymer. However, it has become a problem that inclusion of fluorine in the polymer deteriorates an etching resistance. The silicon-containing film formed from the composition of the present invention can be particularly effectively used for the organic resist composition which is difficult to ensure an etching resistance as described above.

As a usage example of the silicon-containing film obtained from the silicon-containing film-forming composition of the present invention, there is created a photoresist film by a photoresist composition solution on a silicon-containing film after fabrication of the silicon-containing film, and spin coating is preferably adopted then, similarly to the silicon-containing film. After spin coating of the resist composition, prebaking is to be conducted, preferably in ranges of 80 to 180° C. and 10 to 300 seconds. Exposure is conducted then, followed by post-exposure bake (PEB) and development, to obtain a resist film pattern.

In the case that patterning is made on the silicon-containing film as mentioned above, etching is carried out by using a gas mainly comprised of a fluorinated gas such as a fluorocarbon gas. The silicon-containing film formed from the composition of the present invention has characteristics that etching rate by the foregoing gas is fast and film loss of the resist upper-layer film is small.

In a multi-layer resist process adopting the silicon-containing film formed from the compositor of the present invention, a resist lower layer film is provided between the silicon-containing film and a processing substrate. Although the resist lower layer film is preferably an organic film having an aromatic skeleton when the resist lower layer film is used as an etching mask for the processing substrate, the resist lower layer film may be not only an organic film but also a silicon-containing material insofar as its silicon content is 15 mass % or less when the lower layer film is a sacrificial film.

Another usage example of the silicon-containing film shown in the present invention includes a multi-layer resist process using an organic film as an underlayer film capable of being an etching mask for a processing substrate. With this organic film, a resist pattern formed by patterning is transferred to the silicon-containing film and then the formed pattern is transferred again, wherein the organic film is requested to have characteristics that etching can be done under etching condition of high etching resistance of the silicon-containing film and at the same time etching resistance is high under etching condition of the processing substrate.

Such organic films as resist lower layer films have been numerously known as lower layer films for a three-layer resist process or for a bilayer resist process using a silicon resist composition (many resins including novolak resins in addition to a 4,4'-(9H-fluoren-9-ylidene)bisphenol novolak resin (molecular weight of 11,000) described in Japanese Patent Laid-Open (kokai) No. 2005-128509, for example), such that any of them are usable. Further, when it is intended to provide a heat resistance higher than a typical novolak, it is also possible to include a polycyclic skeleton such as 4,4'-(9H-fluoren-9-ylidene)bisphenol novolak resin, and to select a polyimide resin (Japanese Patent Laid-Open (kokai) No. 2004-153125, for example).

Accordingly, when an organic film having an aromatic skeleton is used as the underlyer film, the etching process can be made possible, because the organic film has not only an antireflection effect in a lithography process but also sufficient etching resistance during etching process of a substrate.

The organic film can be formed on the substrate by using a composition solution in the same manner as the photoresist composition, such as by spin coating. After forming the organic film as the resist lower layer film by spin coating or the like, it is desirable to bake it to evaporate an organic solvent therefrom. Baking is to be preferably conducted within a temperature range of 80 to 300° C. and within a time range of 10 to 300 seconds.

Note that the thickness of the organic film as the resist lower layer film is 5 nm or more, particularly preferably 20 nm or more to 50,000 nm or less without particularly limited thereto though the thickness varies depending on the etching condition; the thickness of the silicon-containing film of the present invention is to be 1 nm or more to 100 nm or less, preferably 80 nm or less, and more preferably 70 nm or less; and the thickness of a photoresist film is preferably between 1 nm or more and 150 nm or less.

The present patterning process adopting the three-layer resist process using the silicon-containing film formed from the composition of the present invention is configured as follows.

In this process, an organic film is firstly created on a processing substrate, by spin coating or the like. The organic film is desirably high in etching resistance because the organic film acts as a mask upon etching of the processing substrate, and the organic film is to be desirably cross-linked by heat or acid after spin coating because the organic film is required not to be mixed with an overlying silicon-containing film.

On the organic film, the silicon-containing film to be obtained from the composition of the present invention and a photoresist film are formed by the above-described procedures. According to a usual manner, the photoresist film is: pattern exposed by adopting a light source corresponding to the photoresist film such as KrF excimer laser light, ArF excimer laser light, $F_2$ laser light, or EUV light; heat-treated under the condition adapted to the individual photoresist film; and then subjected to a developing operation by a developer, to allow for obtainment of a resist pattern.

Next, etching is conducted for the silicon-containing film, by using this resist pattern as an etching mask, and under a dry etching condition such as dry etching by a fluorine-based gas plasma where the etching speed of the silicon-containing film is significantly higher than that of the resist film. As a result, a silicon-containing film pattern can be obtained, substantially without undergoing an affection of a pattern change due to side etching of the photoresist film.

Next, the substrate carrying the silicon-containing film pattern having the above obtained resist pattern transferred thereto, is subjected to conduction of dry etching under a condition that the etching speed of the underlying organic film is significantly higher than that of the silicon-containing film, such as reactive dry etching by gas plasma containing oxygen, and reactive dry etching by gas plasma containing hydrogen-nitrogen, to thereby etch the underlying organic film. By this etching process, a pattern of the underlying organic film is obtained, and simultaneously therewith, the resist layer as the uppermost layer is typically lost.

Further, the thus obtained underlying organic film pattern is used as an etching mask to conduct dry etching of the processing substrate such as fluorine-based dry etching, or chlorine-based dry etching, thereby enabling precise etching of the processing substrate.

EXAMPLE

Although the present invention will be concretely explained by describing Synthesis Examples, Comparative Synthesis Example, Examples, and Comparative Examples, the present invention is not limited by the description. Note that the symbol "%" in the Examples represents a mass %, and the molecular weight measurement was based on GPC.

Synthesis Example 1

Into a mixture of 40 g of ethanol, 1 g of methanesulfonic acid, and 50 g of deionized water was added a mixture of 2 g of phenyl trimethoxy silane, 2 g of 3,3,3-trifluoropropyl trimethoxy silane, 2 g of tripropyl borate, and 35 g of tetraethoxy silane; and then the resulting mixture was kept at 40° C. for 12 hours for hydrolysis-condensation. After the reaction, 100 g of propylene glycol methyl ether was added thereinto and then by-produced alcohol was removed by distillation under reduced pressure. Then, 100 mL of ethyl acetate and 300 g of propylene glycol methyl ether were added thereinto, and then a water layer was separated. Into the organic layer remained was added 100 mL of ion-exchanged water; the resulting solution was agitated, settled, and separated into layers. This operation was repeated for 3 times. The organic layer remained was concentrated under reduced pressure to obtain 100 g of a propylene glycol methyl ether solution of silicon-containing compound 1 (10% of polymer concentration). Methanesulfonate ion could not be detected in the obtained solution by an ion chromatography. Polystyrene equivalent molecular weight of the compound was 2500 (Mw).

Synthesis Examples 2 to 6, and Comparative Synthesis Example 1

Each synthesis was conducted in the same manner as Synthesis Example 1 by using monomers shown in Table 1, to obtain the intended silicon compound.

TABLE 1

| | Compound represented by general formula (1) | | Compound(s) represented by general formula (2-1) and/or (2-2) | | Product | |
|---|---|---|---|---|---|---|
| Synthesis Example 1 | F₃C–CH₂CH₂–Si(OCH₃)₃ | 2.2 g | C₆H₅–Si(OCH₃)₃<br>(i-PrO)₃B<br>Si(OEt)₄ | 2.0 g<br>1.9 g<br>35.4 g | silicon-containing compound 1 | Mw = 2,500 |
| Synthesis Example 2 | C₃F₇O–CH₂CH₂CH₂–Si(OCH₃)₃ | 3.5 g | C₆H₅–Si(OCH₃)₃<br>H₃C–Si(OCH₃)₃<br>Si(OEt)₄ | 2.0 g<br>1.4 g<br>35.4 g | silicon-containing compound 2 | Mw = 2,200 |
| Synthesis Example 3 | F–C₆H₄–Si(OCH₃)₃ | 2.2 g | Ge(OC₄H₉)₄<br>H₃C–Si(OCH₃)₃<br>Si(OEt)₄ | 3.7 g<br>1.4 g<br>35.4 g | silicon-containing compound 3 | Mw = 2,800 |
| Synthesis Example 4 | F–C₆H₄–Si(OCH₃)₃ | 2.2 g | H₃C–Si(OCH₃)₃<br>Si(OEt)₄ | 2.7 g<br>35.4 g | silicon-containing compound 4 | Mw = 2,000 |
| Synthesis Example 5 | C₆F₅–CH₂CH₂–Si(OCH₃)₃ | 3.2 g | Ti(OC₄H₉)₄<br>H₃C–Si(OCH₃)₃<br>Si(OEt)₄ | 3.4 g<br>1.4 g<br>35.4 g | silicon-containing compound 5 | Mw = 3,000 |
| Synthesis Example 6 | F₃C–C₆F₄–Si(OC₂H₅)₃ | 3.8 g | P₂O₅<br>H₃C–Si(OCH₃)₃<br>Si(OEt)₄ | 1.4 g<br>1.4 g<br>35.4 g | silicon-containing compound 6 | Mw = 2,500 |
| Comparative Synthesis Example 1 | none | | C₆H₅–Si(OCH₃)₃<br>H₃C–Si(OCH₃)₃<br>Si(OEt)₄ | 2.0 g<br>2.7 g<br>35.4 g | silicon-containing compound 7 | Mw = 2,000 |

Examples 1 to 6, and Comparative Example 1

The silicon-containing compounds 1 to 7 obtained in the Synthesis Examples and the Comparative Synthesis Example, an organic acid, a thermal crosslinking accelerator, a solvent, and an additive were mixed with one another at ratios listed in Table 2, respectively, followed by filtration by a filter made of fluororesin of a 0.1 μm size, to prepare silicon-containing film-forming composition solutions named Sol. 1 to 7, respectively.

TABLE 2

| | No. | Silicon-containing compound (parts by mass) | Thermal cross-linking accelerator (parts by mass) | Acid (parts by mass) | Solvent (parts by mass) | water (parts by mass) |
|---|---|---|---|---|---|---|
| Example 1 | Sol. 1 | compound 1 (4.0) | TPSOAc (0.04) | maleic acid (0.04) | propylene glycol ethyl ether (150) | water (10) |
| Example 2 | Sol. 2 | compound 2 (4.0) | TPSOAc (0.04) | oxalic acid (0.04) | propylene glycol ethyl ether (150) | water (10) |
| Example 3 | Sol. 3 | compound 3 (4.0) | TPSOAc (0.04) | maleic acid (0.04) | propylene glycol ethyl ether (150) | water (10) |
| Example 4 | Sol. 4 | compound 4 (4.0) | TPSOAc (0.04) | maleic acid (0.04) | propylene glycol ethyl ether (150) | water (10) |
| Example 5 | Sol. 5 | compound 5 (4.0) | TPSMA (0.04) | maleic acid (0.04) | propylene glycol ethyl ether (150) | water (10) |
| Example 6 | Sol. 6 | compound 6 (4.0) | TPSMA (0.04) | maleic acid (0.04) | propylene glycol ethyl ether (150) | water (10) |
| Comparative Example 1 | Sol. 7 | compound 7 (4.0) | TPSMA (0.04) | maleic acid (0.04) | propylene glycol ethyl ether (150) | water (10) |

TPSOAc: triphenylsulfonium acetate
TPSMA: mono(triphenylsulfonium) maleate

Next the compositions Sol. 1 to 7 were spin coated, and heated at 200° C. for one minute for film formation, to create silicon-containing films Film 1 to 7 having a thickness of 35 nm. Etching test was then conducted under the following etching condition (1) or (2), for these films, the underlying organic film and the overlying photoresist film to be described. The results are listed in Table 3 and Table 4.

(1) Etching Test by $CHF_3/CF_4$-Based Gas
Apparatus: Dry etching apparatus Telius SP manufactured by Tokyo Electron Limited
Etching Condition (1)
  Chamber pressure: 10 Pa
  Upper/Lower RF power: 500 W/300 W
  $CHF_3$ gas flow rate: 50 ml/min
  $CF_4$ gas flow rate: 150 ml/min
  Ar gas flow rate: 100 ml/min
  Treating time: 10 sec (2) Etching Test by $CO_2/N_2$-Based Gas
Apparatus: Dry etching apparatus Telius SP manufactured by Tokyo Electron Limited
Etching Condition (2)
  Chamber pressure: 2 Pa
  Upper/Lower RF power: 1000 W/300 W
  $CO_2$ gas flow rate: 300 ml/min
  $N_2$ gas flow rate: 100 ml/min
  Ar gas flow rate: 100 ml/min
  Treating time: 15 sec

TABLE 3

| | Silicon-containing film-forming composition | Silicon-containing film | Dry etching speed (nm/min) by $CHF_3/CF_4$-based gas |
|---|---|---|---|
| Example 1 | Sol. 1 | Film 1 | 65 |
| Example 2 | Sol. 2 | Film 2 | 65 |
| Example 3 | Sol. 3 | Film 3 | 64 |
| Example 4 | Sol. 4 | Film 4 | 65 |
| Example 5 | Sol. 5 | Film 5 | 64 |
| Example 6 | Sol. 6 | Film 6 | 65 |
| Comparative Example 1 | Sol. 7 | Film 7 | 60 |
| ArF resist film | — | — | 55 |
| Organic underlayer film | — | — | 35 |

TABLE 4

| | Silicon-containing film-forming composition | Silicon-containing film | Dry etching speed (nm/min) by $CO_2/N_2$-based gas |
|---|---|---|---|
| Example 1 | Sol. 1 | Film 1 | 3 |
| Example 2 | Sol. 2 | Film 2 | 3 |
| Example 3 | Sol. 3 | Film 3 | 3 |
| Example 4 | Sol. 4 | Film 4 | 3 |
| Example 5 | Sol. 5 | Film 5 | 3 |
| Example 6 | Sol. 6 | Film 6 | 3 |

TABLE 4-continued

| | Silicon-containing film-forming composition | Silicon-containing film | Dry etching speed (nm/min) by $CO_2/N_2$-based gas |
|---|---|---|---|
| Comparative Example 1 | Sol. 7 | Film 7 | 3 |
| ArF resist film | — | — | 140 |
| Organic underlayer film | — | — | 60 |

(Pattern Etching Test)

Firstly, a composition (28 parts by mass of resin, and 100 parts by mass of solvent (PGMEA)) containing a 9,9'-bis(4-hydroxyphenyl)fluorene formaldehyd condensation resin (molecular weight of 11,000) was spin coated onto an Si wafer, followed by heating at 250° C. for one minute for film formation, to form an organic underlayer film having a thickness of 200 nm.

Next, Sol. 1 to 7 were coated on the organic underlayer film, followed by heating at 200° C. for 60 seconds for film formation, to form a silicon-containing film as an intermediate layer having a thickness of 35 nm. Further, the ArF resist solution shown in Table 5 was coated on the silicon-containing film, and baked at 110° C. for 60 seconds, to form a photoresist layer having a thickness of 100 nm.

Next, exposure was made with an ArF immersion exposure instrument (NSR-S610C manufactured by Nikon Corp. with NA of 1.30, σ of 0.98/0.65, 35°-dipole polarized illumination, and 6%-half tone phase shift mask), which was followed by baking (PENS) at 100° C. for 60 seconds, and then by development in an aqueous solution containing 2.38% by mass of tetramethyl ammonium hydroxide (TMAH) for 30 seconds to obtain a 43-nm 1:1 positive line-and-space pattern.

TABLE 5

| | Polymer (parts by mass) | Acid generator (parts by mass) | Base (parts by mass) | Water-shedding polymer (parts by mass) | Solvent (parts by mass) |
|---|---|---|---|---|---|
| ArF resist | ArF monolayer resist polymer 1 (100) | PAG 1 (10.0) | Quencher 1 (2.0) | water-shedding polymer 1 (4.0) | PGMEA (2,200) |

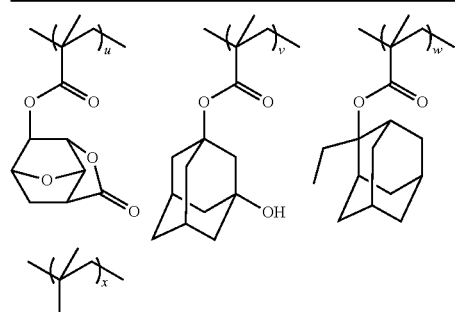

ArF monolayer resist polymer 1
($u = 0.45, v = 0.20, w = 0.30, x = 0.05$ Mw7,800)

TABLE 5-continued

| | Polymer (parts by mass) | Acid generator (parts by mass) | Base (parts by mass) | Water-shedding polymer (parts by mass) | Solvent (parts by mass) |
|---|---|---|---|---|---|

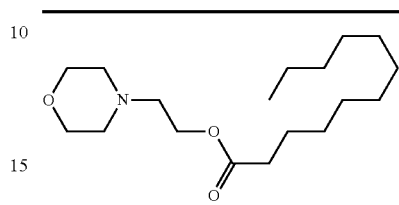

Quencher 1

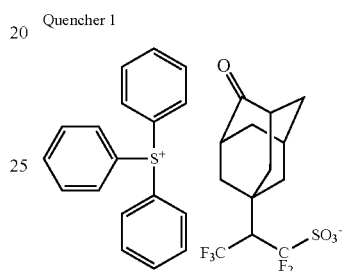

PAG1

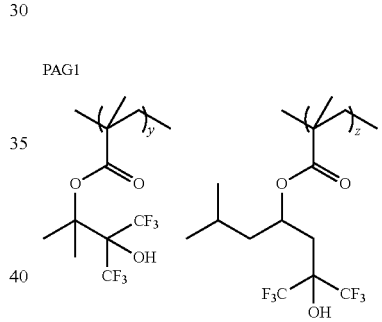

Water-shedding polymer 1
($y = 0.45, z = 0.55$ Mw8,800)

The silicon-containing film was dry etched by using a resist pattern as a mask under the following etching condition (3); and then cross-section form of the pattern was observed by an electron microscope (S-4700, manufactured by Hitachi, Ltd.) and pattern roughness after etching was observed by an electron microscope (CG4000, manufactured by Hitachi High-Technologies Corp.); and respective forms observed were compared and their results are shown in Table 6.

(3) Pattern Etching Test by $CHF_3/CF_4$-Based Gas

Apparatus: Dry etching apparatus Telius SP manufactured by Tokyo Electron Limited Etching Condition (3)

Chamber pressure: 10 Pa

Upper/Lower RF power: 500 W/300 W $CHF_3$ gas flow rate: 50 ml/min $CF_4$ gas flow rate: 150 ml/min Ar gas flow rate: 100 ml/min Treating time: 40 sec

TABLE 6

|  | Lower layer film material | Resist upper layer | Pattern profile after development | Profile after etching for transfer to intermediate layer | Pattern roughness after etching for transfer to intermediate layer |
|---|---|---|---|---|---|
| Example 1 | Organic underlayer film | ArF resist | vertical profile | vertical profile | 3.5 nm |
| Example 2 | Organic underlayer film | ArF resist | vertical profile | vertical profile | 3.3 nm |
| Example 3 | Organic underlayer film | ArF resist | vertical profile | vertical profile | 3.4 nm |
| Example 4 | Organic underlayer film | ArF resist | vertical profile | vertical profile | 3.5 nm |
| Example 5 | Organic underlayer film | ArF resist | vertical profile | vertical profile | 3.3 nm |
| Example 6 | Organic underlayer film | ArF resist | vertical profile | vertical profile | 3.2 nm |
| Comparative Example 1 | Organic underlayer film | ArF resist | vertical profile | vertical profile | 4.1 nm |

As shown in Table 3, etching rate of the silicon-containing film formed by the thermosetting silicon-containing film-forming composition of the present invention with $CF_4/CHF_3$-based gas is sufficiently faster than etching rate of an ArF resist, and as shown in Table 4, etching rate with $CO_2/N_2$-based gas is sufficiently slower than the underlayer film; thus, there is no effect by introduction of a fluorine atom. As shown in Table 6, it can be recognized that, according to the composition of the present invention, a pattern profile after development, a profile and pattern roughness after etching of the silicon-containing film are excellent; and thus, it was found that the silicon-containing film obtained by the composition of the present invention had an adequate anti-reflection function.

The present invention is not limited to the above embodiments. The above embodiments are merely illustrative, and whatever having the substantially same configurations as the technical concept recited in the appended claims of the present application and exhibiting the same functions and effects are embraced within the technical scope of the present invention.

What is claimed is:

1. A thermosetting silicon-containing film-forming composition for forming a silicon-containing film to be formed in a multilayer resist process used in a lithography, wherein the composition comprises at least:

(A) a silicon-containing compound obtained by hydrolysis-condensation of one, or two or more kinds of a hydrolyzable silicon compound represented by the following general formula (1) and one, or two or more reactive compound represented by the following general formula (2-2), or, a silicon-containing compound obtained by hydrolysis-condensation of one, or two or more kinds of a hydrolyzable silicon compound represented by the following general formula (1), one, or two or more hydrolyzable silicon compound represented by the following general formula (2-1), and one, or two or more reactive compound represented by the following general formula (2-2)

$$R^1{}_{m1}Si(OR^2)_{(4-m1)} \quad (1)$$

$$R^3{}_{m3}Si(OR^4)_{(4-m3)} \quad (2\text{-}1)$$

$$U(OR^5)_{m5}(OR^6)_{m6}(O)_{m7/2} \quad (2\text{-}2)$$

wherein $R^1$ represents a monovalent organic group substituted with one or more fluorine atoms and having 1 to 30 carbon atoms; $R^3$ represents a hydrogen atom or a monovalent organic group having 1 to 30 carbon atoms, wherein $R^1$ and $R^3$ may be the same or different with each other; $R^2$ and $R^4$ represent an alkyl group having 1 to 6 carbon atoms; m1 and m3 are integers satisfying $m1 \leq 3$ and $0 \leq m3 \leq 3$, respectively; $R^5$ and $R^6$ represent an organic group having 1 to 30 carbon atoms; $m5+m6+m7/2$ is a valency determined by the kind of U; each of m5, m6, and m7 is an integer of 0 or more; and U is any element belonging to the groups of III, IV, or V in the periodic table, except for carbon and silicon, (B) one, or two or more kinds of a thermal crosslinking accelerator represented by the following general formula (3) or (4),

$$L_aH_bX \quad (3)$$

wherein L represents any of lithium, sodium, potassium, rubidium, and cesium; X represents a hydroxyl group or an organic acid group with one, or two or more valency having 1 to 30 carbon atoms; a represents an integer of 1 or more, b represents 0 or an integer of 1 or more, and a+b is a valency of the hydroxyl group or the organic acid group,

$$M_aH_bA \quad (4)$$

wherein M represents any of a sulfonium group, an iodonium group, and an ammonium group; A represents a hydroxyl group, or an organic acid group with one, or two or more valency having 1 to 30 carbon atoms, or an non-nucleophilic counter ion; a' represents an integer of 1 or more, b' represents 0 or an integer of 1 or more, and a'+b' is a valency of the hydroxyl group, the organic acid group, or the non-nucleophilic counter ion, (C) an organic acid with one, or two or more valency having 1 to 30 carbon atoms, and (D) an organic solvent.

2. The thermosetting silicon-containing film-forming composition according to claim 1, wherein the silicon-containing compound of the component (A) is a hydrolysis-condensation product using an acid as a catalyst.

3. The thermosetting silicon-containing film-forming composition according to claim 2, wherein the acid catalyst is one or more compounds selected from inorganic acids and sulfonic acid derivatives.

4. The thermosetting silicon-containing film-forming composition according to claim 1, wherein M in the general formula (4) is any of a tertiary sulfonium, a secondary iodonium, and a quaternary ammonium.

5. The thermosetting silicon-containing film-forming composition according to claim 2, wherein M in the general formula (4) is any of a tertiary sulfonium, a secondary iodonium, and a quaternary ammonium.

6. The thermosetting silicon-containing film-forming composition according to claim 3, wherein M in the general formula (4) is any of a tertiary sulfonium, a secondary iodonium, and a quaternary ammonium.

7. The thermosetting silicon-containing film-forming composition according to claim 1, wherein U in the general formula (2-2) is any of boron, aluminum, gallium, yttrium, germanium, titanium, zirconium, hafnium, bismuth, tin, phosphorous, vanadium, arsenic, antimony, niobium, and tantalum.

8. The thermosetting silicon-containing film-forming composition according to claim 6, wherein U in the general formula (2-2) is any of boron, aluminum, gallium, yttrium, germanium, titanium, zirconium, hafnium, bismuth, tin, phosphorous, vanadium, arsenic, antimony, niobium, and tantalum.

9. A substrate, wherein the substrate is formed of successively at least an organic film formed on a processing substrate, a silicon-containing film formed on the organic film by using the thermosetting silicon-containing film-forming composition according to claim 1, and a photoresist film formed on the silicon-containing film.

10. A substrate, wherein the substrate is formed of successively at least an organic film formed on a processing substrate, a silicon-containing film formed on the organic film by using the thermosetting silicon-containing film-forming composition according to claim 8, and a photoresist film formed on the silicon-containing film.

11. A patterning process for forming a pattern on a substrate, wherein the patterning process is effected by at least:

forming an organic film on a processing substrate, forming a silicon-containing film on the organic film by using the thermosetting silicon-containing film-forming composition according to claim 1, forming a resist film on the silicon-containing film by using a resist composition of a chemically amplification type not containing silicon, after exposure of the resist film and then alkaline development, pattern-processing of the silicon-containing film by dry etching by using the obtained resist film pattern as an etching mask, pattern-processing of the underlayer organic film by using the processed silicon-containing film pattern as an etching mask, and pattern-processing of the processing substrate by using the processed organic film as an etching mask to form a pattern on a substrate.

12. A patterning process for forming a pattern on a substrate, wherein the patterning process is effected by at least:

forming an organic film on a processing substrate, forming a silicon-containing film on the organic film by using the thermosetting silicon-containing film-forming composition according to claim 8, forming a resist film on the silicon-containing film by using a resist composition of a chemically amplification type not containing silicon, after exposure of the resist film and then alkaline development, pattern-processing of the silicon-containing film by dry etching by using the obtained resist film pattern as an etching mask, pattern-processing of the underlayer organic film by using the processed silicon-containing film pattern as an etching mask, and pattern-processing of the processing substrate by using the processed organic film as an etching mask to form a pattern on a substrate.

13. The patterning process according to claim 11, wherein, in patterning of the resist film, a photo lithography method in which a light having wavelength of 300 nm or shorter or an EUV light is used, or an electron beam drawing method is used.

14. The patterning process according to claim 12, wherein, in patterning of the resist film, a photo lithography method in which a light having wavelength of 300 nm or shorter or an EUV light is used, or an electron beam drawing method is used.

* * * * *